US008537444B2

(12) United States Patent
Gil et al.

(10) Patent No.: US 8,537,444 B2
(45) Date of Patent: Sep. 17, 2013

(54) SYSTEM AND METHOD FOR PROJECTION LITHOGRAPHY WITH IMMERSED IMAGE-ALIGNED DIFFRACTIVE ELEMENT

(75) Inventors: Dario Gil, Latonah, NY (US); David O. Melville, New York, NY (US); Alan E. Rosenbluth, Yorktown Heights, NY (US); Kehan Tian, Poughkeepsie, NY (US); Jaione Tirapu Azpiroz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/618,821

(22) Filed: Sep. 14, 2012

(65) Prior Publication Data

US 2013/0071774 A1    Mar. 21, 2013

Related U.S. Application Data

(62) Division of application No. 12/168,310, filed on Jul. 7, 2008.

(51) Int. Cl.
*G03H 1/08* (2006.01)

(52) U.S. Cl.
USPC ............................................. 359/9; 359/900

(58) Field of Classification Search
None
See application file for complete search history.

(56) References Cited

U.S. PATENT DOCUMENTS

| 4,082,453 A | 4/1978 | Knop |
| 5,415,835 A | 5/1995 | Brueck et al. |
| 5,703,675 A | 12/1997 | Hirukawa et al. |
| 2005/0074698 A1 | 4/2005 | Borodovsky |
| 2006/0072194 A1 | 4/2006 | Lee |
| 2006/0109532 A1 | 5/2006 | Savas et al. |

OTHER PUBLICATIONS

Walsh, "On the design of lithographic interferometers and their application", MIT Thesis (Oct. 2004).
Freschi et al., "Phase locking or superimposed diffractive grating in photoresists", ,OPT. Commun. vol. 208 pp. 41-49 (Jul. 1, 2002).
Breidne et al., "Blazed holographic gratings" Opt. Acta., vol. 26(11), pp. 1427-1441, (1979).
Ross et al., "Nanostructured surfaces with long range order for controlled self-assembly", NSF Nanoscale Sci. & Eng. Grantees Conferences (4 pages) (Dec. 2003).
Cescato et al., "Self-diffraction for intrinsic optical modulation evolution measurements in photoresists", Appl. Opt., vol. 27(10), pp. 1984-1987 (May 1988).
Cescato et al., "Fourier synthesis for fabricating blazed gratings using real-time recording effects in a positive resist", Appl. Opt., vol. 27(10), pp. 1988-1991 (May 1988).

*Primary Examiner* — Jade R Chwasz
(74) *Attorney, Agent, or Firm* — Scully, Scott, Murphy & Presser, P.C.; Daniel P. Morris, Esq.

(57) ABSTRACT

A system and method and computer program product for exposing a photoresist film with patterns of finer resolution than can physically be projected onto the film in an ordinary image formed at the same wavelength. A hologram structure containing a set of resolvable spatial frequencies is first formed above the photoresist film. An illuminating wavefront containing a second set of resolvable spatial frequencies is projected through the hologram, forming a new set of transmitted spatial frequencies that expose the photoresist. The transmitted spatial frequencies include sum frequencies of higher frequency than is present in the hologram or illuminating wavefront, increasing the resolution of the exposing pattern. Designing lithographic masks further includes fabricating the hologram and projecting the illuminating wavefront. A simple personalization based on Talbot fringes and plasmonic interference is further performed.

5 Claims, 9 Drawing Sheets

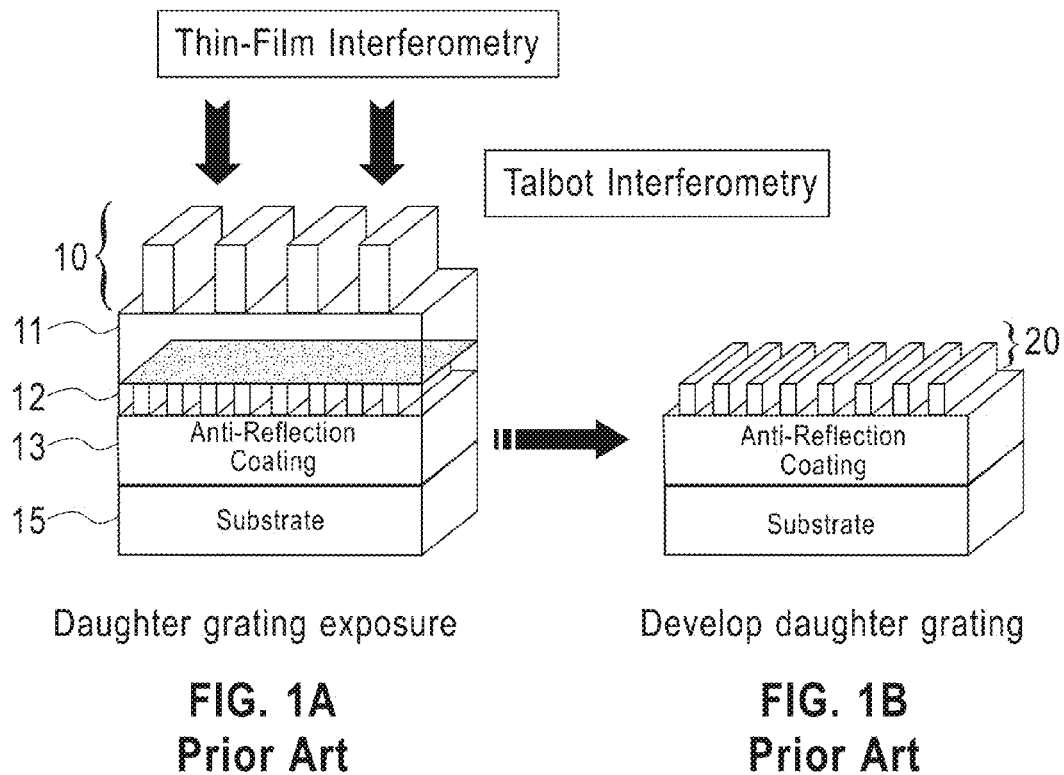
FIG. 1A
Prior Art
FIG. 1B
Prior Art
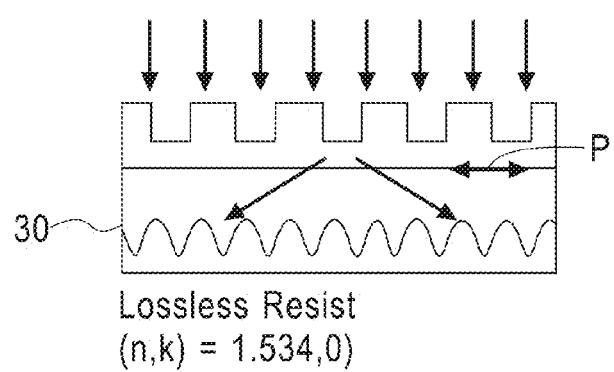
FIG. 2
Prior Art

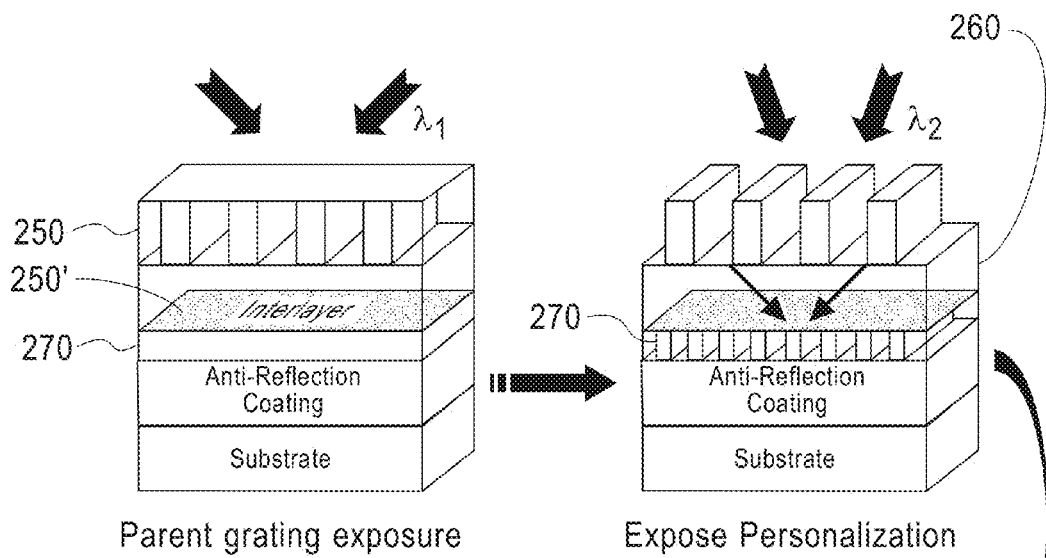
Parent grating exposure
FIG. 8A
Expose Personalization
FIG. 8B
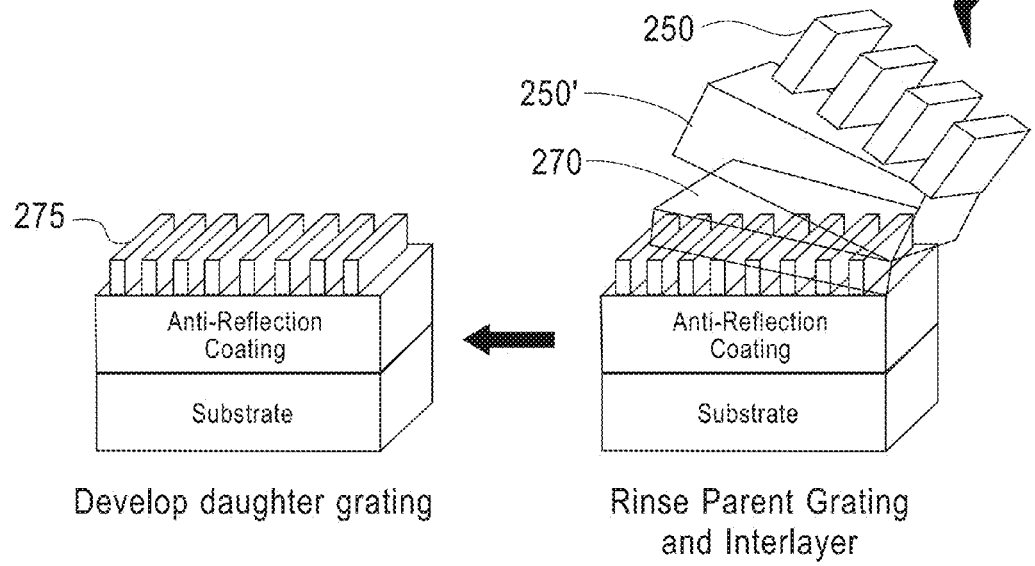
Develop daughter grating
FIG. 8D
Rinse Parent Grating and Interlayer
FIG. 8C Parent grating exposure Expose Personalization Daughter grating
Exposure personalization Rinse Parent Grating
and Interlayer Develop daughter grating

SYSTEM AND METHOD FOR PROJECTION LITHOGRAPHY WITH IMMERSED IMAGE-ALIGNED DIFFRACTIVE ELEMENT

RELATED APPLICATIONS

This application is a divisional of U.S. application Ser. No. 12/168,310, filed Jul. 7, 2008.

BACKGROUND OF THE INVENTION

1. Field

The present invention relates generally to lithographic formation of integrated circuit patterns, and more particularly to a method for generating the spatial frequency modulation of a lithographic pattern by projecting a light beam that has been modulated with a set of spatial frequencies through a hologram modulated by a signal having a second spatial frequency modulation.

2. Description

The resolution of a lithographic image is limited by the wavelength of the light that forms it. Currently, source wavelengths shorter than $\lambda=193$ nm (e.g., as provided by an ArF excimer light source) are not contemplated for IC manufacture until the future era of soft x-ray lithography. Fortunately, wavelength is reduced inside a medium, and a favorable reduction of as much as 1.8× can potentially be obtained for propagating waves within photoresist films. This corresponds to an upper limit of 1.8 for the resist refractive index for example. Current resists typically have refractive indices of around 1.5 to 1.7 when sensitized.

Considerably larger reductions in the effective wavelength are possible in images formed from evanescent waves. However, evanescent waves can only exist in extremely thin films, and even the somewhat larger thicknesses that are typically given to photoresist films (of order 0.1-1.0 microns) are microscopic on the scale of the lens elements which propagate the light from mask to wafer. With the possible exception of imprint templates for specialized applications, practical semiconductor manufacturing requires that circuit patterns first be fabricated on 4× expanded masks, and then de-magnified to final size using a projection lens. The macroscopic size of conventional projection lenses makes them unsuitable for exploiting waves that become evanescent in any medium between the resist film stack and the mask.

In fact, until recently, lithographic projection lenses were incapable of introducing spatial frequencies into the image that corresponded to wavelengths shorter than the vacuum wavelength. This is because the waves had to propagate through an air space between the last lens element and the wafer film stack (with air having essentially the same n=1 index as vacuum). A solution has recently been developed to overcome this limitation, namely filling the intervening space with water, whose index is about 1.44 at 193 nm. Note that a spatial frequency component at the 1.44 limit would propagate parallel to the wafer surface in such water immersion systems, with no projected component of propagation along the lens-to-wafer axis. In practice image spatial frequencies are therefore gated by a smaller effective index of about 1.35, since diffraction-limited transfer from a lens of reasonable diameter to an image of reasonable field size entails an upper limit on the propagation angle of order 70°. Because of this optical design margin, the maximum NA in lithography lenses is limited to roughly 0.93 times the refractive index of the coupling medium.

Increasing the refractive index of the immersion fluid is challenging with a 193 nm source wavelength, because high index fluids tend to have high absorption in the deep UV. Viscosity, defects, and evaporatively or absorptively driven thermal fluctuations also become concerns, as does chemical stability and compatibility under UV loading. It is not clear whether these problems can be solved with any 193 nm immersion fluid of index higher than water. Moreover, the lens elements in 193 nm systems also face stringent materials requirements, and their refractive index is currently limited to n=1.56 or below. The optical design margins noted above show that lens element refractive indices would gate the NA to a maximum of about 1.45 even if an acceptable high index immersion liquid were possible. This is because the final lens element generally cannot have a concave exit surface since the immersion cavity would then become impractically thick along the optical axis, greatly stiffening the already difficult-to-surmount materials requirements that a hypothetical high-index immersion fluid must meet.

In fact, it is currently believed that the materials challenges involved in significantly raising the refractive index of the final lens element are at least as difficult as those faced in raising the index of the coupling medium. Achieving the necessary freedom from minute levels of index in-homogeneity and uncorrectable birefringence is extremely difficult at 193 nm, given the element sizes and tolerance levels needed for advanced lithography lenses. Thus, with existing methods of projection lithography the spatial frequency content of the projected image ends up being gated by an effective wavelength of about $\lambda/1.35$, potentially limiting the miniaturization of future semiconductor designs. There are a few known approaches for addressing this problem. First, the spatial frequency limit can be improved by numerical factors through techniques like multiple patterning, or frequency doubling (e.g. by using phase shift masks or oblique illumination).

The first class of methods, so-called multiple patterning methods, are theoretically capable of solving the index-limited resolution problem of conventional single exposure/patterning methods. (Multiple patterning methods involve using more than one mask exposure and pattern transfer to print a single level of the integrated circuit, instead of the single exposure and patterning that are traditionally used.) Multiple patterning can avoid the spatial frequency limit because the frequency content of a printed chip level can theoretically be stepped down arbitrarily by carrying out the pattern transfer of successive closely-neighboring features in separate steps, with each separate image including only one of the features at a time. However, such processes require that the patterns transferred in any additional exposure be very narrow in order to allow subsequently transferred features to fit in the gaps between them. Unfortunately, even with one dimensional (1D) layouts, the tight transfer process control needed to print a narrow feature from a wide image will usually prevent a doubling of minimum manufacturable resolution from being feasible by this means—resolution improvements are typically quite a bit less than 2×. Even under ideal conditions, achievement of more than a doubling of resolution would require three or more transfer steps, which would cause cost to rise very substantially. Note that with two-dimensional (2D) patterns, a full doubling of resolution in every cross-section (e.g. along both the x and y axes) is not even theoretically possible if only two exposures are used.

Current lithographic practice exploits frequency doubling to improve resolution. Frequency doubling is based on the fact that photoresist responds in an identical manner to the positive and negative half-cycles of each amplitude harmonic. Since exposing intensity is the square of the electric field, the spatial frequency bandlimit in the exposing intensity image is twice that of the incoming amplitude spatial frequencies. This means, for example, that one can print a periodic array of patterns with twice as fine a periodicity by alternately tiling each repeat with positive or negative phase. It is possible to take advantage of this enhancement in resolution without insisting that the imaged pattern take the form of positive and negative replicas in exact balance; however when such a balance is present the patterns have no amplitude in the DC order, also known as the zero order, and classic frequency doubling obtains.

Frequency doubling can be implemented (when patterns are compatible) by appropriately applying opposite phase shifts to neighboring features on the reduction mask; alternatively, a broadly equivalent effect can be achieved by illuminating the mask from an oblique set of directions. These techniques have become widely used, and have significantly improved the resolution capabilities of semiconductor technology. However, this classic approach is inherently unable to provide more than a single doubling of resolution. New methods will be needed further extend the spatial frequency content of lithographic images. Such methods should preferably be compatible with the current practice of exploiting frequency doubling.

One antecedent projection lithographic technology in the prior art include: Thin Film Interference Talbot Lithography (also known as In-Situ Interference Lithography). In Thin-film interference, e.g., Talbot lithography, employs a so-called "parent" grating (of lines and spaces) that is fabricated on an initial layer of, for example, photoresist as shown in FIG. 1. Interference lithography is a well-known method for fabricating such a grating. As shown in FIG. 1, when illuminated from above by a normally incident plane wave, it is known that (in the conventional Fresnel diffraction regime) such a grating 10 will produce duplicate images of itself in periodically spaced planes below the grating lines, and further that denser images having a two-times finer pitch will be produced in intermediate planes that lie midway between the planes of the duplicate images. Such three-dimensional (3D) interference structures are known as Talbot fringes.

In a Talbot fringe thin-film interferometry method shown in FIG. 1A, a parent diffraction grating pattern 10 is formed on a layer of photoresist 11 using well known techniques, for example by projecting an image of a master grating, or by imprint lithography, or by two-beam interferometric lithography. The photoresist 11 is prevented from being exposed when this grating 10 is formed. Prevention may be accomplished by using imprint lithography, with use of a $2^{nd}$ wavelength, or, sensitivity may be switched on via diffusion from a substrate underlayer. The photoresist 11 is formed over a dielectric layer 12 (e.g., an oxide, nitride or oxynitride) formed on a Silicon or Silicon—containing material substrate 15. In the structure shown in FIG. 1, an anti-reflective coating 13 such as an absorbing film or a graded index film may be formed as a layer between the dielectric and substrate. Then, using well known techniques, through flood illumination (e.g., with a plane wave) of the parent grating 10, a daughter grating 20 is ultimately patterned as shown in FIG. 1B. If the grating is properly spaced away from the photosensitive film, line/space fringes of doubled frequency are produced. Frequency doubling results from suppression of the zero order for example. In current implementations, the incident illumination is formed by light at wavelengths ranging between about 157 nm and 300 nm. The dimensions of the grating are often of only millimeter scale in experiments but can be 1 cm or larger. The grating pitch is limited by what conventional methods can fabricate, which in the case of projection methods might be in the range of 150 nm.

Extension of the Talbot concept to dimensions of current lithographic interest requires operation outside the scalar Fresnel regime. It has been shown that very small features can be printed in a sensitive layer beneath a parent grating that has been designed to diffract the waves into the +/−1st orders exclusively, thus eliminating all propagation in the normal incidence direction (0th order) and so producing an ideal two-beam interference pattern with half the pitch, as illustrated in FIG. 2. As shown in FIG. 2, elimination of the zero order creates a frequency-doubled fringe pattern 30 that is formed from alternated regions of positive and negative amplitude, as in phase mask lithography. Under ideal circumstances, the minimum achievable spatial frequency, "P" as indicated in FIG. 2, with this technique (in configurations where the standoff is large enough to suppress evanescent waves) is dictated by the index of refraction of the resist medium, according to the equation 1) as follows:

$$\frac{1}{P_{min}} = \frac{2n_{resist}}{\lambda}, \qquad 1)$$

where $P_{min}$ is the smallest pitch that can be achieved in the printed line/space pattern. The factor of "2" in equation 1) represents the gain from frequency doubling, while $n_{resist}$ (which may be as large as 1.7 or 1.8, but can potentially be larger), represents an improvement in resolution beyond the effective value of 1.35 which gates current projection lithography. Talbot lithography provides this gain because it does not require propagation of the Talbot fringes through an immersion liquid; instead these frequency-doubled fringes are created at the upper surface of the wafer film stack shown in FIG. 1.

In the scalar Fresnel regime, suppression of the zero order simply means matching the areas of the positive and negative transmission regions of the grating. Restriction of the propagating orders to +/−1 will often improve doubled-frequency contrast in the Fresnel regime. The classical scalar structure with such a diffraction pattern is a grating whose transmission profile is given a sinusoidal form, producing a pure intensity sinusoid (plus DC) at the doubled frequency. However, if the doubled frequency is printed at a depth below the grating that is sufficient to damp out evanescent waves; one may employ variant profiles that include additional non-propagating high frequencies, so long as the propagating spectrum has the desired two-beam form. If $n_{resist}$ is 1.8, the resulting doubled spatial frequency will be considerably finer than can be achieved with current prior-art projection lithography. Note that the grating must be fabricated on the film stack without exposing the imaging resist layer. In the prior art, this has been accomplished by forming the Talbot fringes using a different wavelength from that used to print the grating, so that resists with different spectral sensitivities can be used in the two steps.

One drawback to Talbot lithography is that the printed features are restricted to periodic line/space patterns. Most useful semiconductor structures involve more complex features. While there is a significant subset of semiconductor devices whose design layouts are relatively simple (and moreover such devices may be of particular importance at the ultra-high resolutions where difficulties in device scaling make large and complex circuit layouts more problematic), pure line/space patterns are only of limited utility.

A second difficulty arises in fabricating the parent grating. This must contain structure as fine as half the desired output Talbot spatial frequency, which for a wavelength of 193 nm and a photoresist index of refraction $n_{resist}=1.8$, must be of the order of 100 nm if one wishes to approach the limit allowed by equation 1. Some of the state-of-the-art techniques described above can provide such fine resolutions, which can then be reduced further through Talbot lithography; however such spatial frequencies for the parent grating fall near the limit of current lithographic technology, and can prove difficult to manufacture. A more fundamental difficulty is that future semiconductor technologies will require printing pitches that are considerably smaller than the wavelength, and under such circumstances electromagnetic effects due to interaction of the incident light with the resist topography produces an undesired increase of the energy diffracted into the 0th order, hence critically degrading the double-frequency Talbot image in this regime. It has been shown that the 0th order tends to increase rapidly as the grating pitch decreases below 180 nm. For this reason a standard grating structure will generally be unable to provide the sub-wavelength frequency-doubled fringe pattern that is needed to achieve a resolution superior to current projection technology.

A further antecedent projection lithographic technology in the prior art include: Thin Film Thin Film Interference Lithography using Surface Plasmons. In this technique, complex electromagnetic effects also arise when light is transmitted through grating arrays (1D or 2D) of pinholes or slits in metallic films, particularly metals whose dielectric constant has a large negative real part. The waves that are excited can be understood as evanescent spatial frequencies, allowing the gratings to be handled with a wave-based numerical methodology.

Recently, a contact lithography process was demonstrated where surface plasmons were launched on a grating array manufactured out of silver, a plasmonic metal, in such a way that they could interfere to produce a standing wave that could be used as an aerial image to expose a thin resist. FIG. 3 shows an example in the form of a 2D FDTD (Finite Difference Time Domain) simulation, where a 60 nm layer of silver 40, for example, has been patterned with 60 nm openings 45, for example, on a 300 nm period. The silver is then exposed with 436 nm wavelength light. This causes surface plasmons to be created on the top and bottom surfaces. On the bottom surface, counter propagating surface plasmons interfere to present a standing wave 48 that can be used to expose the underlying resist.

Thus far only gratings have been proposed for plasmonic lithography, limiting this technique to very specialized applications. And, as with Talbot parent gratings for sub-wavelength spatial frequencies, analysis of the plasmonic gratings is numerically intensive.

Contrast Enhancement Layers

A known method for improving contrast in a projected image of given shape (i.e. composed of a given set of bright and dark features) is to project the image through a bleachable film that is placed just above the resist layer which is used to capture the image. The exposing set of bright and dark features is imprinted into the bleachable film as a transmission profile, so that the film transmits more light where bright features pass through it, and less light where the features are dark. The sidewalls of the transmitted image are also sharpened. Such a bleachable film is known as a Contrast Enhancement Layer (CEL). Variant CEL materials are known that exhibit a thresholded behavior in their bleaching. CELs thus comprise photosensitive films that can sharpen the sidewalls of an exposing pattern after being optically imprinted with an initial pattern. A CEL layer does not change the pitch of the transmitted image (by design the basic pattern of bright and dark features is unchanged with CELs).

Solid Immersion Lithography

It is known in the art that one can avoid the need to propagate an NA>1 image through an immersion medium by using so-called solid immersion lithography. Here the flat outside surface of the final lens element is placed in direct contact with the resist stack on the wafer. (A lens element with such a flat surface is referred to as "plano".) Though this contact might well be accomplished using a high index liquid, the thickness of the contacting layer is made sufficiently small as to cement the lens to the film stack, and such microscopic thicknesses in the cementing layer ease many of the requirements that a high index coupling medium needs to fulfill in the macroscopic thicknesses required for conventional immersion operation.

A significant problem with the solid immersion approach however, is that large-NA projection systems can only be optically corrected to the diffraction limit over fields that are quite small; typically somewhat smaller than a single chip, and far smaller than a silicon wafer. This means that a relatively small instantaneous image must be scanned across the wafer (in synchrony with a scanned mask) in order to expose a full chip area, and further that this chip-exposure must be stepped out across the wafer for later batch processing of the printed chip array. Unfortunately, a microscopic liquid layer prevents relative motion between the lens and wafer, and it cannot be rapidly applied or released.

Thus, it is the case that lithographic technology is currently constrained by limits on the spatial frequency content of projected images. However, reduction mask projection technology provides a number of advantages, including a well-developed logistical infrastructure for efficiently manufacturing circuit structures of prescribed shape, and the ability to exploit phase tiling to double the spatial frequency limit. Solid immersion lithography is relatively impractical, and can only be expected to extend the spatial frequency limit of projection systems by a small margin since the refractive index of the final lens element that is contacted to the resist stack is currently limited to n=1.56 or below. Non-projection systems have various drawbacks, e.g., Talbot lithography (a/k/a in-situ interference lithography). Talbot lithography is relatively inflexible in the patterns it can produce, and it cannot easily provide high contrast frequency doubling as feature sizes become strongly sub-wavelength, due to EMF enhancement of the zero order at these dimensions.

As known, Plano final surfaces are highly desirable in immersion systems that use a macroscopic coupling fluid, and in solid immersion systems such surfaces are inherently required. From a fundamental point of view, the reason that the refractive index of the final lens element imposes a limit on the resolution of solid immersion lenses is that the power in the final surface needs to be zero (i.e., the element must be plano), in order that the final surface can be optically contacted to the wafer stack. In lenses with a conventional macroscopic coupling space, it is possible to include power in a macroscopically flat final surface by applying a diffractive structure, i.e. by forming a Fresnel lens of concentric rings in the flat surface. However, such a lens element (alternately referred to as a diffractive or holographic element) is not suitable as a final contacted lens surface in a lithographic system that seeks to overcome the limitations imposed by the refractive index of the exit space by placing the final element in close proximity to the wafer. One reason is that a microscopic offset between the macroscopic Fresnel lens and the macroscopic image field implies that the Fresnel lens and image field must have almost exactly the same size. However, the Fresnel lens increases the NA from, for example, 1.35 to 1.8, and this must necessarily demagnify the field size in the same ratio. In a conventional configuration, the holographic element can be spaced away from the image field and given a larger diameter, but this is not possible in a solid immersion system where materials limitations force the high index space between the hologram and image to be quite thin. A related problem is that the aberrations in a Fresnel lens of such high power would be impossible to correct in a telecentric system. A Fresnel lens is given its power by a radial variation in spacing between diffracting fringes, and when the Fresnel lens is placed in contact with the image, its diffracting fringes take the form of a locally varying grating, whose aberrations vary over the field in a complicated way that differs from those of the conventional refractive surfaces in the remainder of the lens that might otherwise be used to correct it.

One could contemplate resolving this problem by using purely holographic imaging, i.e. by creating a customized (information-rich) hologram of the desired wafer pattern, which due to the microscopic standoff would essentially take the form of a moderately defocused waveform of the image. Such a configuration would involve no projection lens, so difficulties in stepping or scanning a contacted wafer would not arise. The hologram would inject its information into the film stack at only a microscopic distance from the imaging layer.

The drawback to such a holographic approach is that the problem of fabricating an ultra-high-resolution image is simply re-posed as that of fabricating the hologram. For this reason, the conventional holograms do not offer the desired path to improved resolution, since the resolution needed to fabricate them is in general no coarser than the resolution attainable in the diffracted patterns that they can form.

It would be highly desirable to provide an improved system and method for forming lithographic images of integrated circuit patterns, and more particularly, what is needed is an improved holographic projection lithographic system for high resolution patterning at sub-resolution dimensions.

It would be highly desirable to provide an improved system and method for forming lithographic images that implements holographic elements for frequency re-doubling.

SUMMARY OF THE INVENTION

It is an object of the present invention to provide a system and method that produces super resolution lithographic images in substrates that employ immersed diffractive holographic elements.

The present invention relates generally to a semiconductor method that includes forming a diffractive hologram above a photosensitive medium, e.g., a resist film, and then projecting a second pattern through the hologram to expose the resist.

In one embodiment, the resist is inhibited from exposure when forming the diffractive hologram prior to exposing the resist.

In one aspect of the invention, resolution is increased because sum frequencies are generated when the modulated input beam is diffracted by hologram.

In a further aspect of the invention, the same hologram is used to print many different patterns, simply by changing the exposing pattern. Thus, many different patterns may result from the optimized use of spatial frequencies.

According to a first aspect of the invention, there is provided a lithographic processing method of exposing a photosensitive medium formed in a wafer of semiconductor material to form an image of specified spatial frequency modulation, said method comprising:

forming, atop a semiconductor wafer stack and adjacent to a photosensitive medium layer, a modulated diffractive hologram structure having a first spatial frequency modulation in its profile and refractive indices; and, illuminating the formed diffractive hologram structure with a wave field having a second spatial frequency modulation, which combines with the first spatial frequency modulation to produce a specified spatial frequency modulation specified for the image.

Further to this aspect, a diffractive hologram structure includes a grating, wherein a formed image pattern includes alternating bright and dark regions of a specified spatial frequency modulation formed in the photosensitive medium layer.

Further to this aspect, the lithographic method further includes: inhibiting the photosensitive medium layer from exposure during forming of the diffractive hologram structure; and, switching on sensitivity of the photosensitive medium layer after forming the diffractive hologram structure. In one embodiment, avoiding premature exposure of the primary photosensitive layer includes giving the hologram formation layer a much higher sensitivity.

Moreover, further to this aspect, the spatial frequency modulation produced by the hologram is a sum of frequencies of the first and second spatial frequency modulations. Moreover, in an alternate embodiment, the second spatial frequency modulation includes spatial frequencies of evanescent wave orders.

In a further embodiment, the hologram structure is printed using partially coherent projection lithography, having spatial frequency content of up to $2*P*NA/\lambda$ diffraction orders along each radial direction, wherein P is the period of the first spatial frequency modulation, NA is the numerical architecture of the projection lens and $\lambda$ is the wavelength of the first spatial frequency modulation used to print the hologram.

In a further embodiment, the amplitudes of the diffraction orders is an adjustable variable when forming the hologram structure.

In a further embodiment, the forming of the hologram structure results in a patterned image exploiting frequency doubling such that an amplitude bandlimit of the printed image is $4*P*NA/\lambda$.

In a further embodiment, a patterned reduction mask for modulating the wave field is implemented to form the second spatial frequency modulation.

In a further embodiment, modulated diffractive hologram structure is formed in a photosensitive medium layer having an increased or decreased transmission characteristic under irradiation.

In a further embodiment, the modulated diffractive hologram structure is formed in a semiconductor film using one or more of: imprint lithography, or by etching apertures into the opaque film, a photosensitive medium layer by exposing and developing a conventional photoresist layer.

In a further embodiment, the amplitude spatial frequency content of an image pattern achieves a non-evanescent spatial frequency of about $1.91/\lambda$, where $\lambda$ is the vacuum wavelength of the exposing wavefront.

In a further embodiment, a pitch spacing between an alternating bright and dark region ranges between the size of an exposed region of a semiconductor material, and one half the wavelength of the exposing light within a photosensitive material, or, for example, in the range between 1 cm and 50 nm.

According to a second aspect of the invention, there is provided a method for designing a mask implemented for fabricating a hologram structure in a photosensitive layer of a semiconductor stack and for generating an optimized wavefield for illuminating the hologram structure to achieve a specified image target comprising alternating bright and dark pattern region in a photosensitive material layer of the stack, the method comprising:

a) selecting a preliminary wave field and hologram diffractive properties using a scalar model at an artificially reduced spatial frequency wavelength;

b) implementing wavefront engineering method to generate a physical structure for the hologram in a preliminary solution and a $1^{st}$ stage wave field for modulating the hologram;

c) implementing local optimization to provide an optimized design for the hologram and a wavefront at the artificially decreased wavelength;

d) incrementing the wavelength in a small upward increment;

e) refining, at the incremented wavelength, the local optimization to tune in a solution for the current incremented wavelength by adjusting variables of a hologram profile, an index of the hologram features and a film stack beneath the hologram; and, f) iterating between steps d)-e) to arrive at a solution which is valid at an operating wavelength, the solution including a $2^{nd}$ stage wave field for modulating the hologram, wherein a spatial frequency modulation in a resulting image includes the same bright and dark regions as the image target; and, g) generating a pair of lithographic masks suitable to generate $1^{st}$ stage and $2^{nd}$ stage wave fields at respective first and second sets of spatial frequencies using the wavefront engineering method.

In each of these embodiments of the invention, the mask design method employs an electromagnetic optimizer when iterating between steps d)-e), the optimizer maximizing lithographic process window utilization and, maximizing a range of light dose and focus fluctuations within which the bright and dark polarity patterns in the developed image match the target patterns to within an acceptable tolerance.

In the mask design method, the iterating between steps d)-e) results in a solution valid at a specified operating wavelength.

In a further alternate embodiment, the hologram structure is a parent grating structure, the iterating between steps d)-e) resulting in a solution having a minimized zero order diffraction by the parent grating by an interlayer designed to produce reflections capable of canceling a propagating $0^{th}$ order wavefront.

According to a further aspect of the invention, there is provided a method of exposing a photosensitive resist layer with an image including a pattern of specified spatial frequency modulation, the method comprising:

forming a first parent grating structure over a film stack, the film stack including a photosensitive layer of material;

exposing the first parent grating structure with a wave field energy at a first modulation frequency to form a diffractive hologram structure above the photosensitive material layer;

illuminating the formed diffractive hologram structure with wave field energy at a second modulation frequency to form an image pattern at the photosensitive material layer, wherein the formed image pattern exhibits enhanced spatial frequencies including a sum of first and second modulations frequencies when the wave field energy at a second modulation frequency is diffracted by the diffractive hologram structure.

Further to this aspect of the invention, there is further comprising a step of personalizing the image pattern formed in the resist layer by the image pattern by illuminating the diffractive hologram structure via a reduction mask at the second modulation frequency.

Further to this aspect of the invention, there is further comprising steps of:

removing the diffractive hologram structure; and personalizing the image pattern formed in the resist layer by the image pattern by illuminating the diffractive hologram structure via a reduction mask at the second modulation frequency after the removing.

Further to this aspect of the invention, there is further comprising steps of:

using the diffractive hologram structure to print many different patterns in the photosensitive material layer by changing the exposing pattern via a reduction mask at a second modulation frequency.

In a further aspect of the invention, all embodiments of the invention require electromagnetic (E&M) optimization.

BRIEF DESCRIPTION OF THE DRAWINGS

The objects, features and advantages of the present invention will become apparent to one skilled in the art, in view of the following detailed description taken in combination with the attached drawings, in which:

FIG. 1 depicts generally, a prior art Thin Film Interferometry concept wherein Talbot fringes of two-times finer pitch are used to print a daughter grating from a parent grating;

FIG. 2 depicts a prior art Talbot lithographic technique capable of producing an ideal two-beam interference pattern having elimination of the zero order to create a frequency-doubled fringe pattern in a resist;

FIG. 8 illustrates method steps for forming a Line/space Talbot grating that represents a simple example of a quasi-universal hologram.

DETAILED DESCRIPTION OF THE PREFERRED EMBODIMENTS

Figure 3:
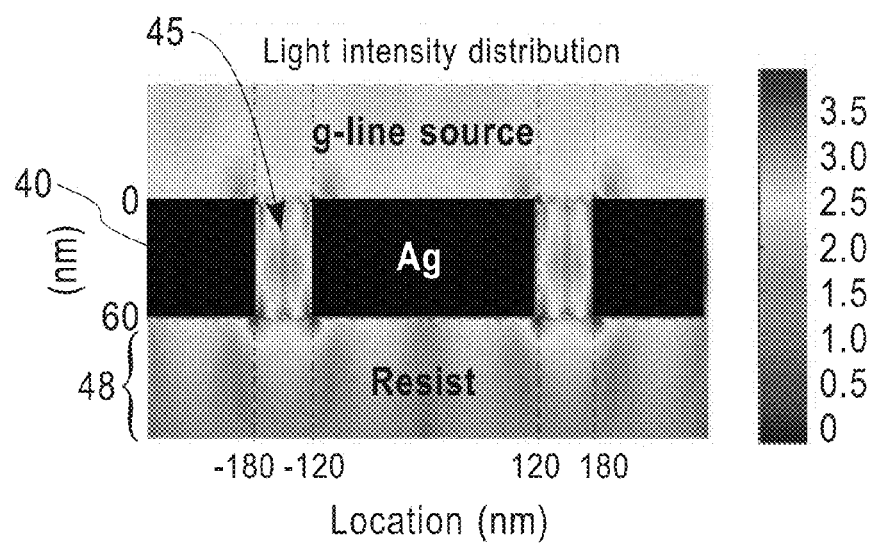
FIG. 3 depicts a thin film interference lithographic technique using Surface Plasmons.

The present invention is directed to a system and method for producing super resolution lithographic images in substrates that employs holographic elements for image patterning.

A hologram structure containing a set of resolvable spatial frequencies is first formed above the photoresist film. If necessary the photoresist is then sensitized. An illuminating wavefront containing a second set of resolvable spatial frequencies is projected through the hologram, forming a new set of transmitted spatial frequencies that expose the photoresist A key idea of the present invention is to deploy a conveniently large portion of the information content in the final image on a reduction mask, rather than encoding it entirely in a diffractive hologram. This enables exploitation of the extensive logistical infrastructure that has been developed in the semiconductor industry for flexibly encoding design information in reduction masks.

In an example embodiment of the invention, that advantage is maximized by, in a 1st stage, patterning the diffractive structure onto the wafer in a single quasi-universal design which allows many different high-resolution final patterns to be produced via projection of different 2nd-stage reduction masks onto the diffractive structure. (In certain cases, a high reflectance hologram may instead be positioned below the resist layer, for single-level device applications that allow such a buried grating structure in the substrate.) Because the structure formed in the first stage is diffractive, it serves a different role from so-called Contrast Enhancement Layers as they cannot print patterns at the sum spatial frequency that the present invention identifies between the exposing and imprinted versions of the pattern (for example, at double the frequency).

In example embodiments of the present invention, the spatial frequency information encoded in the 2nd stage reduction mask is sufficiently extensive that the remaining spatial frequency content (which must be deployed in the wafer-mounted diffractive element) will be strongly bandlimited; sufficiently bandlimited that the element can be formed using a standard lithographic projection system (particularly when nonlinear enhancement of the structure's frequency content occurs during post-expose steps in the hologram fabrication process). In these embodiments an ultra-high resolution image is fabricated using two stages of exposure with images of conventional resolution. In most of these embodiments there is no need to form intermediate features in either stage that are dramatically finer than ½ the period of the maximum projected spatial frequency. In this respect, the present invention offers an advantage over conventional double-exposure methods for pitch reduction.

A key enabling technology for all embodiments of the invention is an accurate electromagnetic solver that can be used in an efficient way by an optimization algorithm. Such solvers, also referred to as E&M codes, have become well-known in the field of semiconductor lithography as means for calculating the effect of the finite thickness of mask topography on the light transmitted through the apertures of masks. Most often the E&M codes used in semiconductor lithography solve Maxwell's equations using either a finite-difference time domain method, or a coupled wave algorithm. Optimization algorithms are also well-known in the art, being referred to by such terms as algorithms for nonlinear constrained optimization, or algorithms for NLP (Non-Linear Programming). Software codes incorporating these algorithms are available commercially. When an optimizer is used with an E&M solver to adjust structural or electromagnetic inputs to substantially achieve a specified output, the combined set of software is referred to herein as an E&M optimizer. Unlike the electromagnetic effects that arise in reduction masks (which are physically fabricated at 4x the scale of the final image), the interaction of the incoming field with the wafer-mounted diffractive structure cannot usually be understood as a simple perturbation on a classic thin-screen diffraction problem.

In some cases the nonlinearity involved in developing an exposed image to form the hologram can be exploited to produce higher spatial frequencies. Talbot imaging can be carried out in a way that constitutes a special case of this approach, and in this respect provides a solution to the problem of achieving adequate resolution during hologram fabrication, in the special case of a grating pattern. By exposing an upper imaging layer with a pair of plane waves that propagate at +NA and −NA (achievable, for example, by projecting a phase mask), one can form a parent grating of doubled frequency (since no zero order is present). If the parent grating in turn yields no significant transmission into its own zero order upon illumination by a plane wave (after activation of the second imaging layer), then another frequency doubling will be achieved in the transmitted Talbot fringes. True superresolution is thus obtained. Unfortunately, such line and space patterns are only useful for very specialized devices.

Figure 4:
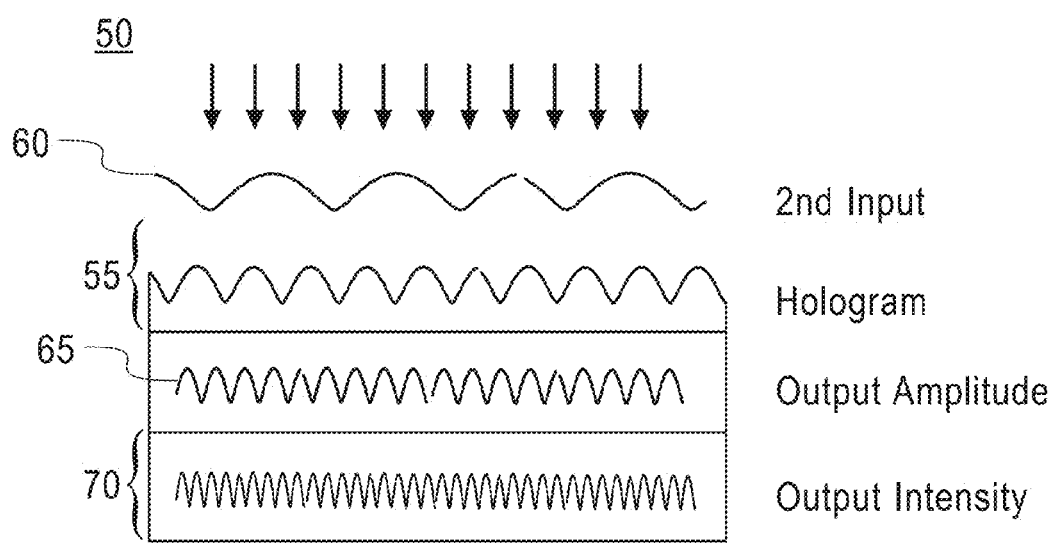
FIG. 4 depicts an example wafer stack structure employing a holographic image-aligned element for frequency re-doubling according to one embodiment of the invention.

FIG. 4 depicts an example wafer stack structure 50 employing the holographic image-aligned element for frequency re-doubling according to one embodiment of the invention. As will be described in greater detail herein below, the method for forming the wafer stack structure employing the holographic image-aligned element employs a frequency doubling in forming the hologram.

In one example embodiment of the invention, as shown in FIG. 4, a diffractive element (e.g., hologram) 55 is fabricated atop a wafer (e.g., silicon) stack to form the integral structure 50. The present invention accommodates the limited field sizes of lithography lenses, i.e., the invention can function when the element is physically affixed to a scanned or stepped wafer. This means that unlike a conventional diffractive optical element, the diffractive structure of the present invention does not exhibit conventional optical power along the lens axis; instead its design must locally encapsulate information about only the region of the final designed image that image forming waves can reach. This region of influence is very small since the image is formed in a plane that is microscopically offset from the diffractive structure.

That is, in a first embodiment, a projection system is used to illuminate the formed diffractive structure (hologram) 55 with a wavefront that has been modulated by a patterned reduction mask 60. The total image then shows enhanced spatial frequency content 70. Spatial frequency enhancement includes not only the frequency doubling seen in Talbot fringes 65, and the high frequencies that are produced in evanescent orders, but also the summed frequencies 70 that are generated by the interaction of the incoming wave with the diffractive hologram. Such summed frequencies 70 have not previously been contemplated for use in lithography. Past efforts to exploit evanescent waves have been limited to short-range propagation from 1:1 masks, while Talbot-fringe images have been limited to simple line-and-space patterns. In embodiments that do not involve evanescent waves, the maximum amplitude spatial frequency obtained in the image is given by equation 1) provided above, where $n_{resist}$ might be, for example, 1.8 but may range from about 1.5 to 2.0. In some applications, the circuit being fabricated may only attain minimum pitch along a single direction; for example, in the "x" or horizontal direction. Such circuits may be designed using coarser ground rules in the orthogonal "y" direction. For such fabrication applications, the equation 1) limit immediately summarizes the resolution capability of the present invention in this embodiment.

The present invention further provides the capability of fabricating other kinds of circuits that achieve the equation 1) limit in the full 2D spatial frequency domain. If both the hologram and illuminating wave field are formed by reduction mask projection that reaches the spatial frequency limit of $1.35/\lambda$, the information in the combined image will then be bounded by an amplitude spatial frequency limit no larger than about $1.91/\lambda$. Given realistic resist indices, this implies that the limited resolution of projection technology will enable achieving the equation 1) limit in the combined image. As another example, with the hologram and illuminating wave field formed using a non-immersion "dry" system (coupling index=1) whose frequency content will be limited to about $0.93/\lambda$, the spatial frequency of the combined image may reach $1.32/\lambda$. That is, the invention enables one to achieve the projection limit for immersion systems using only non-immersion tooling. Such a system can achieve resolutions that approach the equation 1) limit when full resolution is not needed in both axes.

Further details regarding the provision of alternate embodiments for frequency doubling will be discussed in further detail herein below.

Figure 5:
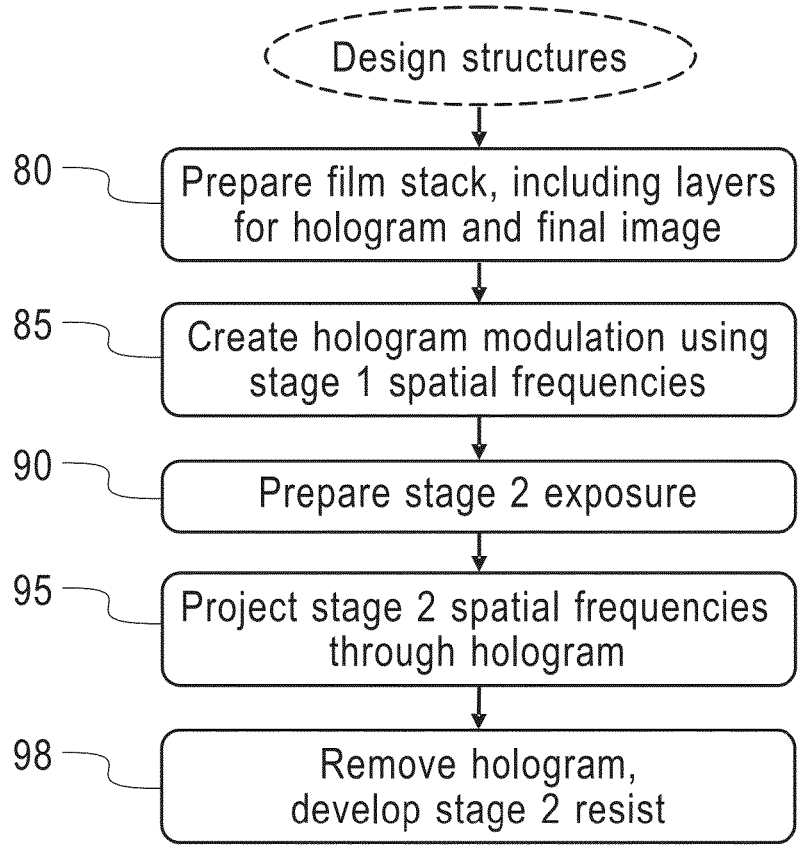
FIG. 5 depicts a procedure for manufacturing the structure of the present invention.

FIG. 5 depicts a procedure 75 for manufacturing the structure of the present invention. Referring to FIG. 5, as depicted at step 80, the hologram element may be formed from any medium that can be modulated, and which can in turn modulate an incoming beam (wavefront). For example, the hologram element 55 (of FIG. 4) may be fabricated in a film whose transmission is altered under irradiation (either increased or decreased), or it may be fabricated using imprint lithography, or by etching apertures into an opaque film, or by exposing and developing a conventional resist layer, whose developed profile may modulate the transmitted field in amplitude as well as phase, with the amplitude and phase range being determined by the imaginary and real parts respectively of the resist material (which may be modified using additives such as dyes), as well as by the resist thickness. When the hologram is formed in a resist layer one may use standard equipment for semiconductor lithography to expose the hologram pattern, in which case a suitable material is standard photoresist, in a thickness comparable to the depth of focus of the lithographic projection lens, which for current state of the art equipment, is a thickness of about 50 nm.

Referring back to FIG. 5, in one embodiment, the hologram modulation is formed by first exposing a photosensitive medium with an image (a stage 1 of the full process) as depicted at step 85; however, it would be desirable that the hologram's modulation be fixed during a second stage (e.g., stage 2) exposure of the imaging layer as depicted at step 90. If the hologram is formed in a conventional photoresist film, the modulation can be fixed by simply developing the resist. This freezing of the modulation is not essential; if the hologram modulation does in fact change during the stage 2 exposure, the effect of this alteration can be taken into account (and to some extent compensated) during the design process to be described in further detail below.

In FIG. 5, as depicted at step 80, the hologram element must ordinarily be fabricated on the film or film stack including an image resist layer however, in a manner without fully exposing the imaging resist layer. If the hologram is fabricated by exposing and developing a conventional resist film, this may be accomplished, for example, by using thermal or chemical diffusion (e.g., from an underlayer) to activate sensitivity in the stage 2 resist film after the hologram has been printed, or by using imprint lithography, or by using different wavelengths during the stages 1 and 2 exposures. Alternatively, the stage 2 resist layer can be given a weaker dose sensitivity than the resist layer in which the hologram is formed, so that the stage 2 layer remains essentially unexposed during hologram formation. If hologram fabrication does give rise to a non-negligible exposure in the stage 2 resist layer, the effect can be taken into account (and corrected, at least to some extent) during a design procedure to be described in greater detail herein below. The films in the film stack may include any materials used in semiconductor fabrication, so long as the materials do not undesirably alter the transistors in the underlying semiconductor wafer. Suitably inert materials include spin-on polymers and dielectric films. The required film thicknesses and refractive indices (and thus the specific materials choices) are determined using an optimizer in conjunction with an E&M solver. Generally the indices would be in the range of 1.35 to 2.0, and more usually in the range of about 1.5 to 1.8. The films which are between the hologram and the stage 2 resist layer must transmit a substantial portion of the stage 2 exposure light. If the stage 2 exposure is carried out using conventional semiconductor lithography equipment, it will not be possible to achieve perfect spatial coherence during this exposure, and as a result it might be desirable to limit the total thickness of the stage 2 resist layer and the films which are between this layer and the hologram to the range of about 100 nm to 200 nm.

The various alternative methods for controlling sensitivity during the first and second stage exposures, i.e., preparing the stage 2 exposure, is depicted as step 90 in FIG. 5. In a further step 95 shown in FIG. 5, the stage 2 spatial frequency projection (e.g., of the 2nd-stage illuminating wave field) through the hologram in a resist layer is performed. The projected image, in one embodiment, may exhibit frequency doubling. The hologram is then removed and the resist developed to provide the final pattern at step 98.

In each of the embodiments described herein, one can exploit frequency doubling in either of the two projected images, or in the final image. Other kinds of fabrication nonlinearities may be exploited to produce higher spatial frequencies in the hologram than are present in the image which prints it. For example, sharp edges in the fabricated hologram may be a source of sharp (predominantly evanescent) edge fields that are highly localized.

Correcting Fabrication Compromises in the Hologram by Adjusting the Stage 2 Wave Field Although processing effects can add higher spatial frequencies to the fabricated hologram, it may be at the expense of being able to fully control lower spatial frequencies. A degree of control can be recovered by including a model of the hologram-formation process in the optimization algorithm that designs it. In one embodiment, the number of controlling degrees of freedom in the image that prints the hologram is limited. However, distortions in the hologram spectrum can partially be compensated using adjustments in the 2nd-stage illuminating wave field. Such compensation is necessarily imperfect in most cases because a larger number of spatial frequencies are usually being controlled than are present in the illuminating wave field alone. Fortunately, however, in other embodiments, there may be no need to produce a specific set of spatial frequency values in the combined image. Instead, the combined image is printed in a layer of binary resist, and merely require of the image that it be above threshold in a sufficiently complete portion of those regions designated to have bright polarity, and that the image be below threshold in a sufficiently complete portion of dark-polarity regions; in other words, it is required that the spatial frequency modulation produced in the resist have the proper bright and dark regions. It is noted that, consistent with CD tolerances, a limited shrinkage in the extent of each bright and dark regions may be allowed to provide a transition of finite width. In addition, it has become common even with current lithographic processes to adjust the designed shape of circuit features to accommodate lithographic limitations. Finally, it is noted that the non-evanescent spatial frequency limit of 1.91/λ exceeds that of most resist and spacer films, meaning that the two optical exposures often have "extra" spatial frequencies that can be traded off in the design. Systematic processing distortions may make it infeasible to achieve a precise target value in every spatial frequency in the fabricated hologram, but the value of one spatial frequency can be traded off against another when optimizing against the fabrication model.

Figure 6:
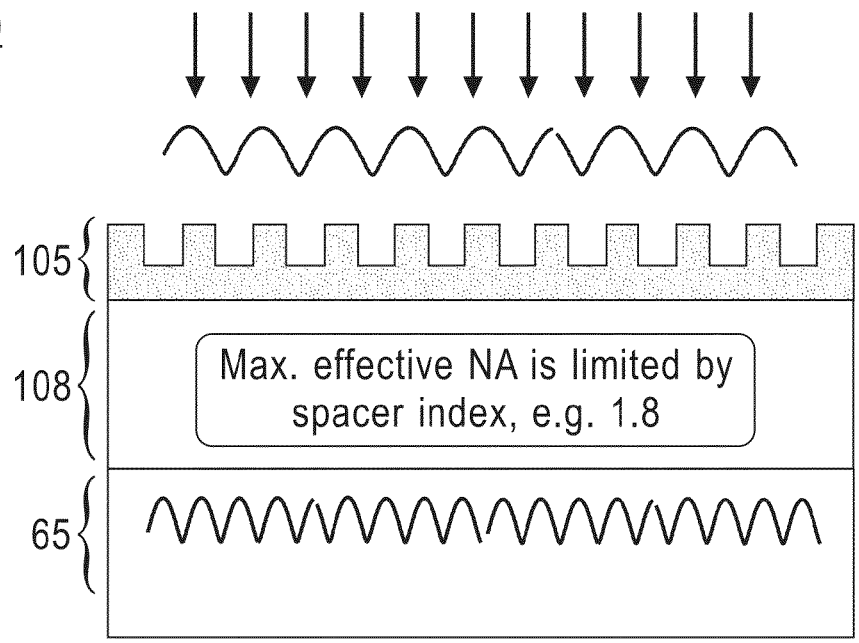
FIG. 6 depicts an exemplary stack structure showing the resulting amplitude transmission of the hologram including a spatial frequency filter to help engineer a solution.

FIG. 6 depicts a spatial frequency filter that can be engineered to provide a solution. Particularly, the system 100 depicted in FIG. 6 employs a hologram 105 and a spacer layer 108 acting as the filter. The refractive index of the spacer may range between 1.35 and 2.0. Essentially, any spin-on polymer or dielectric material can be used, as long as it transmits the stage 2 exposure wavelength. The spacer 108 functions as a filter enabling removal of spatial frequencies whose amplitudes would be deleterious to the resulting image 65. These filtered frequencies can then be given whatever values arise in setting the amplitudes of the retained lower spatial frequencies to their proper values in the face of processing distortions. The bandlimit of the retained frequencies still comfortably exceeds that available from standard reduction technology.

Fundamentally, the image-aligned hologram acts as a lens element, and as such it is likely to exhibit large aberrations (referring to the degradation imposed on an incident image that merely needs to be re-imaged to a new conjugate by the hologram). The hologram would generally be positioned close to the focal plane of the projection lens that illuminates it; typically within the lens depth of focus, or a small multiple thereof, which for state-of-the-art lithographic equipment would mean a position within about 100 nm of the focal plane. As the hologram is approximately positioned at the focal plane, the illuminating wave field is designed to precisely correct the hologram aberrations on a point-by-point basis. Thus, the image-aligned character of the hologram is a key factor in the viability of this approach. If the reduction mask includes features with three (3) different phases, it is possible to project an arbitrarily phased wave field (with arbitrary amplitude variation) onto the hologram. This can be used to correct for the focal shift between the hologram and exposed image, as well as for the hologram aberrations. Since waves propagate from the hologram at virtually all angles, the stand-off between the hologram and imaging layer should typically be smaller than the transverse coherence length of the illuminating wavefront, in order to avoid blurring the image.

Design of the Hologram and 2nd Stage Illuminating Field

Detailed simulation is an important element of any viable procedure for designing the hologram and illuminating wavefield. The required simulations generally include simulation of the lithographic process involved in the substep of fabricating the hologram, and simulation of the diffraction step by which the extended frequency final image is created. In one embodiment, the amplitudes of key spatial frequencies in the hologram and stage 2 wavefront as primary problem variables are used. In embodiments where the hologram is fabricated using optical lithography, these spatial frequency variables are the amplitudes of the diffraction orders that are captured by the projection lens during each exposure (stage 1 and stage 2). Additional structural variables can be used; for example, the refractive indices and thicknesses of films between the hologram and resist layer (as well as the indices of the hologram and resist film themselves). It is also possible to use other process adjustments as variables (e.g. development parameters that might be used to tune the hologram profile). The illumination used in the stage 2 exposure would typically be highly coherent, but the exposure used to fabricate the hologram (in embodiments where it is fabricated optically) may be partially coherent, meaning that a number of (typically adjustable) source variables would be involved.

Considering a one dimensional periodic pattern that is bilaterally symmetric for purposes of illustration, the total number of independent diffraction orders that can be used to print the hologram is $2*P*NA/\lambda$, where λ is the wavelength, P is the period, and NA is the numerical aperture of the projection lens. The amplitudes of these orders constitute one set of variables that can be adjusted to obtain the desired image. This expression takes into account the restriction imposed by bilateral symmetry, but also considers the additional degrees of freedom represented by orders that can be collected by including off-axis directions in the source shape. (Lithographic exposure tools typically limit these directions to the bright-field range subtended by the NA.)

The intensity distribution that prints the hologram contains intensity spatial frequency harmonics out to $2*NA/\lambda$ (for a total harmonic count of $2*P*NA/\lambda$). This intensity spatial frequency bandlimit is twice the bandlimit of the amplitude distribution produced by each source point—a consequence of the fact that intensity is the square of amplitude. However, because these intensity harmonics ($2*P*NA/\lambda$ in number) are produced by spatial frequency doubling, it is not necessarily possible to adjust all of their magnitudes independently, even though an equal number of independent variables (the $2*P*NA/\lambda$ order amplitudes) are available in the collected wavefront. However, even when this possibility is ignored, at a minimum, the intensity pattern which exposes the hologram has at least $P*NA/\lambda$ degrees of freedom that are fully controllable. The superposition of these amplitudes is referred to as the first (or stage 1) spatial frequency modulation.

The connection between this stage 1 exposing pattern and the resulting amplitude transmission of the hologram depends on the specific type of hologram that is employed. The exposing pattern is referred to as the "stage 1a modulation", and the resulting spatial frequency modulation of the hologram's transmission as "stage 1b modulation". The exposure-to-transmission relationship may be highly nonlinear, but this is usually acceptable, as long as the hologram fabrication is modeled accurately. This is in contrast to the very specific nonlinearities that are required in double patterning techniques like so-called double-expose/double-etch processes, or processes that use CEL in two exposures. In these techniques it is necessary that the processes involved in transferring the image into the medium have a strong nonlinearity of a very specific type, namely one that shifts the effective print threshold to a level either barely above the intensity minimum, or just below the intensity maximum. Such a nonlinearity is required in order that the printed features be biased very small, in one polarity or the other. These prior-art double-patterning methods need to produce such a bias in features of one polarity in order that the separations of opposite polarity be large enough that the features of the other exposure have room to "squeeze through".

The present invention avoids the need to create large gaps for the second stage patterns to pass between; instead, the second stage patterns are deliberately diffracted through the first stage patterns that are imprinted in the hologram.

The stage 2 wavefront (also referred to as the stage 2 [or second] spatial frequency modulation) is given a fairly high spatial coherence in order to allow reasonable thickness in the film stack. For example, to filter evanescent frequencies, a film stack of about 200 nm thickness may be used; in that case, the hologram will not be in close focus, so it would be desirable to restrict the illuminating pupil fill during the stage 2 exposure to a radius of about 10% of the NA. (The illuminating pupil fill refers to the range of directions that illuminates a patterned mask that, in turn, is projected through the hologram during the second stage exposure. Though the pupil is only sparsely filled when the stage 2 mask is illuminated, the mask generally spreads this light to such an extent as to substantially fill the collection pupil of the projection lens.) Under these conditions the number of degrees of freedom (order amplitudes) available in the stage 2 exposure is $P*NA/\lambda$.

The illuminating coherence can be reduced if evanescent waves are used, introducing additional degrees of freedom.

Thus, the two stages together offer a minimum of $2*P*NA/\lambda$ independently adjustable degrees of freedom, which in a 1-Dimensional example is sufficient to fully control the image produced by a hypothetical lens having double the NA of the projection lens actually used. In most cases, additional degrees of freedom would be available in many forms; from an increased set of collected diffraction orders during the partially coherent stage 1 exposure, from the detailed source design of the stage 1 exposure, from nonlinearities such as frequency doubling that arise in forming the hologram, and from adjustments of thicknesses and refractive indices of the film stack. Moreover, the present invention makes available the usual lithographic option of exploiting frequency doubling in the final image when the patterns are compatible; in such cases the $2*P*NA/\lambda$ amplitude bandlimit of the final image becomes a fully exploited $4*P*NA/\lambda$ bandlimit in intensity. As noted above, the two stage lithographic procedure usually makes many extra degrees of freedom available for controlling these spatial frequencies. If the image does not make use of evanescent waves, the film indices can be used to filter extraneous high frequencies from the image—in this case, the amplitudes arising in these frequencies are unimportant. It should be noted that, in addition to frequency doubling in the final image, frequency doubling may be exploited during formation of the hologram, enabling resolution extension into the evanescent regime.

Design generation generally requires intensive optimization of the hologram and stage 2 orders together. Typically this optimization would be local rather than global, due to the complexity of the problem, though the local optimization can be supplemented with non-local search steps. Local optimization in turn requires a starting (preliminary) solution, which is then refined to a fully satisfactory solution obeying all required constraints. Such a starting solution can be found for the present invention when the core optimization algorithm is embedded in a continuation procedure. This continuation procedure begins the design in an artificially scalar regime, then transforms the problem to the ultra-high NA scale of the physical image.

Figure 7:
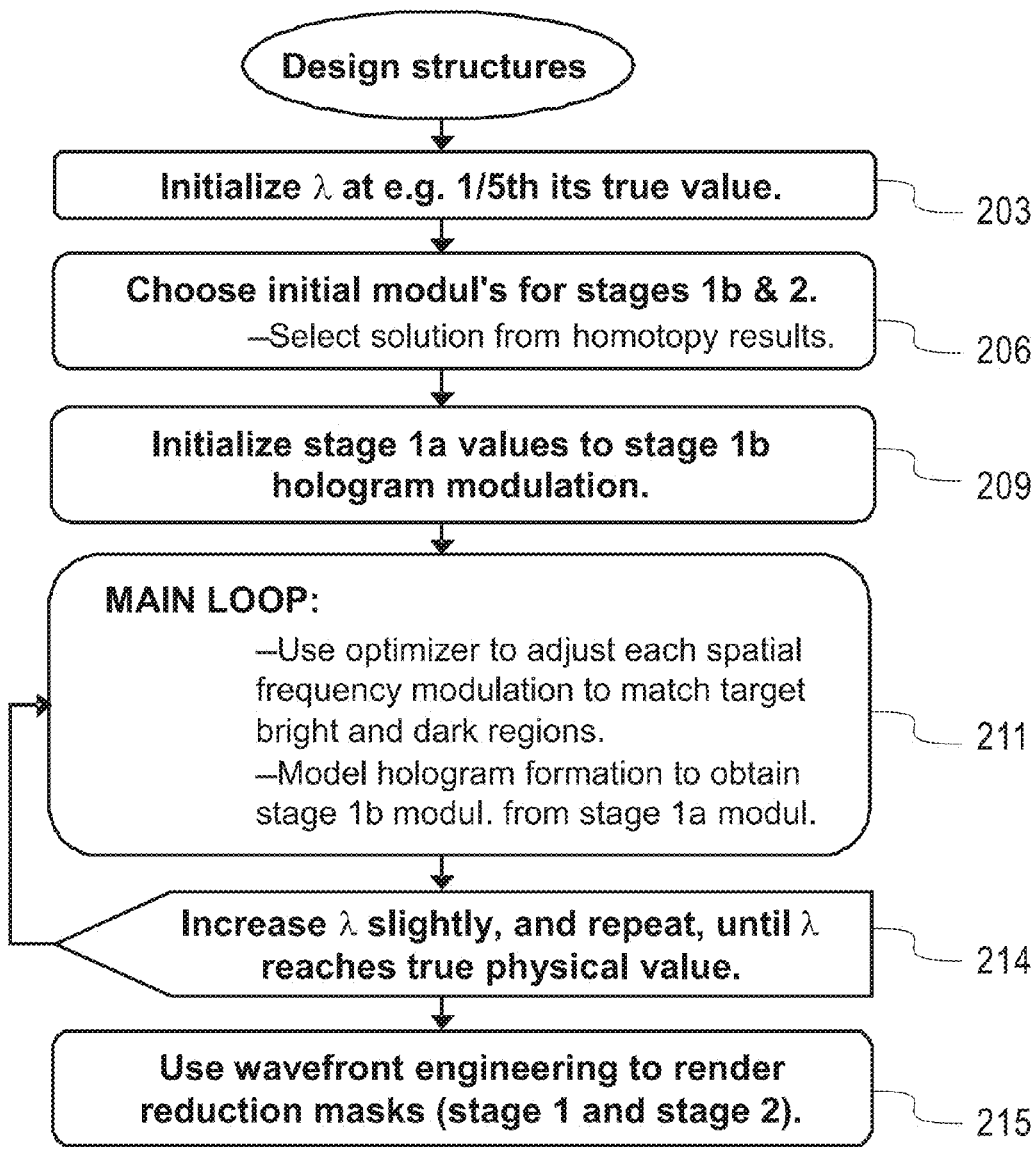
FIG. 7 depicts a flowchart showing a procedure that can be used to design masks for producing the stage 2 exposing wavefront, and fabricating the hologram.
Figure 9A:
FIG. 9 illustrates method steps for fabricating a Line/space Talbot grating, without personalizing the image (as in FIG. 8)
Figure 9A:
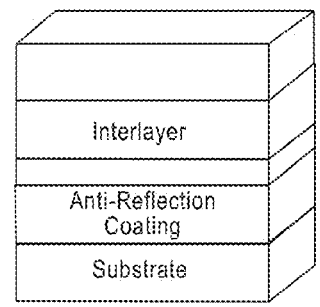
Figure 9B:
Figure 9B:
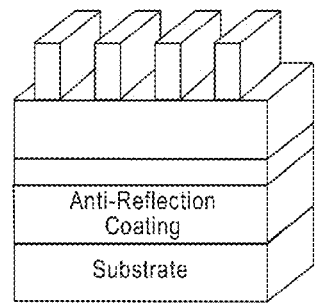
Figure 9D:
Figure 9D:
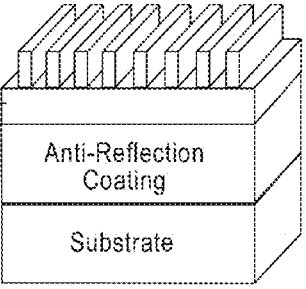
Figure 9D:
Figure 9C:
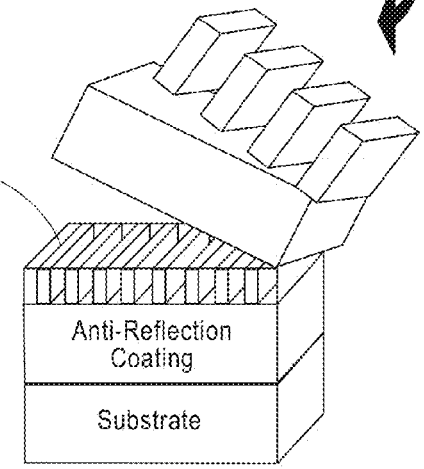
Figure 9E:
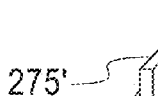
Figure 9E:
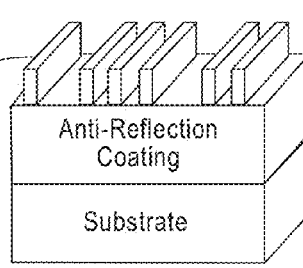

FIG. 7 illustrates an example methodology 200 which may be implemented to design masks for producing the stage 2 exposing wavefront and for fabricating the hologram. The procedure begins by temporarily assuming an artificially reduced wavelength (several-fold reduced) at step 203, such as by artificially initializing $\lambda$ to a lower value, e.g., about ⅕th its true value. At this fictitious short wavelength the geometries become sufficiently coarse as to be approximately analyzable in the Fresnel regime. Furthermore, low spatial frequencies in the holograms are defined as one set of variables (stage 1b), and the spatial frequencies in the 2nd exposure as another (stage 2). Typically each set would contain $N=P*NA/\lambda$ variables.

It is understood that materials constants for the various structures are constrained to limits appropriate to the true physical wavelength. Then, as depicted at 206, one chooses a preliminary wave field and hologram diffractive properties (stage 1b modulation) using a simple scalar model. Thus, at this step, up to 2N diffraction orders of the desired final image are decided. It is understood that intensity orders may be only approximately determined, and multiple amplitude choices may be available to provide it, e.g. frequency doubling. Many options to choose from as many different images yield valid printed pattern.

In the Fresnel regime, a suitable physical structure for the hologram may thus be devised using so-called "wavefront engineering" algorithms, as have been developed to design reduction masks having specified diffractive properties such as described in the reference to A. E. Rosenbluth, et al. entitled "Optimum Mask and Source Patterns to Print a Given Shape," Journal of Micro/Nanolithography, MEMS, and MOEMS 1, No. 1 (2002), p. 13, the entire contents and disclosure of which is wholly incorporated by reference herein. When calculating the image using an artificially shortened wavelength, the algorithm correspondingly applies an artificial filter that trims all spatial frequencies from the image which would not be present if the wavelength assumed its physical value. In reduction masks, wavefront engineering algorithms allow binary patterns to be employed in producing gray-level spectra. In the context of the present invention, restriction to a binary hologram constitutes a processing distortion. In alternate embodiments of the invention, the imaging layer is offset from the imaging layer by a spacer film of thickness sufficient to damp out evanescent waves. In the Fresnel regime such waves will not be evanescent, but an optimizer ignores their contribution when assessing image quality. The fact that many spatial frequencies in the hologram will not propagate to the imaging layer when illuminated by a bandlimited field means that the binary character of the hologram can be maintained.

However, feature size constraints in the hologram will put additional burden on the content of the illuminating field, so some control of the hologram profile may be desirable (i.e. non-binary hologram). This may be achieved without increasing the spatial frequency bandlimit of the image that forms the hologram, by, for example, exposing the hologram in a film or film stack having structured sensitivity, as is done in dual damascene processes.

Thus, continuing, simultaneous quadratic equations may be solved to obtain values for the stage 1 and 2 variables. Example: With bilaterally symmetric patterns, $2^{(N-1)}$ solution classes, in general. Then, there is generated binary mask and hologram shapes that contain these frequencies (implementing "Wavefront engineering".)

As indicated at step 209, FIG. 7, there is initialized hologram formation mask transmission values to the hologram modulation values, which may be binary. Once the preliminary solutions for the hologram formation mask ("1a values") and wavefront (modulation stage 1b) have been optimized at the artificially decreased wavelength, the wavelength is incremented upwards in a small step. Particularly, as indicated at 211, FIG. 7, a processing loop is entered in which an E&M optimizer is employed, as described herein above, to fine tune the solution as the wavelength is incremented upwards as shown at step 214. That is, the implemented E&M optimizer is used to adjust collected mask orders (stage 1a and stage 2 masks), plus the film stack, in order to maximize suitability of diffracted "image", e.g. to match target shape. The increase of wavelength λ is slight, each iteration, and the loop is repeated, until wavelength λ reaches its true physical value.

The preliminary solution retains an almost workable character even at the new wavelength because the wavelength increment is kept small. This proximity to a local minimum in turn allows the local optimizer, at step 211, to tune in a solution for the new wavelength by refinement of the preliminary solution. Note that the adjusted variables include not only the hologram profile (which may be multi-stepped), but also the index of the hologram features and the film stack beneath the hologram. By iterating this procedure by the loop of steps 211 and 214, a solution is arrived which is valid at the operating wavelength. Note that during each iteration, the optimizer need not create a specific set of spatial frequency amplitudes in the image; instead it is only necessary that the spatial frequency modulation in the image contain the same bright and dark regions as the target pattern. The optimizer can, for example, use maximization of lithographic process window as its objective, i.e. the optimizer maximizes the range of dose and focus fluctuations within which the bright and dark polarity patterns in the developed image match the target patterns to within an acceptable tolerance.

At step 215, FIG. 7, after convergence is complete, a pair of lithographic masks to create the two sets of spatial frequencies involved in the final solution is then generated using e.g., the wavefront engineering method described in above-mentioned reference to A. E. Rosenbluth, et al. entitled "Optimum Mask and Source Patterns to Print a Given Shape". That is, wavefront engineering methods are then used to render stage 1a and stage 2 reduction masks.

Quasi-Universal Holograms to Produce a Range of Images within a Restricted Class As it is not uncommon to adopt circuit design practices which impose restrictions on the shape and layout of circuit features in order to accommodate limitations in lithographic technology, in the context of the current invention, this kind of compromise allow use of more universal designs in the hologram. In some embodiments, the hologram may be manufactured by Talbot or interference lithography, thereby lowering cost. In certain embodiments of this kind, the information content of the illuminating wave field can also be restricted, e.g. to project only relatively coarse illuminating images onto the hologram. For example, as shown in FIG. 8, a simple parent grating, i.e., a line/space hologram 250, can be illuminated with a coarser set of binary shapes, thereby deploying the printed Talbot-like fine lines within (lower resolution) bounding boxes of arbitrary shape.

FIG. 8 illustrates method steps for forming a Line/space Talbot grating 275 including forming, according to well-known fabrication techniques, a parent grating structure 250 in a top layer 250' of a film stack by exposing it to a stage 1 wave field, as depicted in FIG. 8. The thickness of layer 250' might be in the range of 25 nm to 100 nm, with 55 nm being a typical value. Any standard photosensitive material and development process might be used, with typical refractive indices of around 1.7, for example, in a high sensitivity formulation in which 20 millijoules are required to expose one square centimeter of target area. This hologram structure 250 is formed by exposing a resist layer 250' at a processing step (a) with a stage 1 wave field (wavefront) represented as $\lambda_1$ in FIG. 8. When the hologram is used to print selective sections of pure line/space Talbot fringes, the stage 1 wave field may take the form of two interfering plane waves that are incident at equal and opposite angles. Then, at processing step (b), FIG. 8, the hologram 250 is selectively exposed in order (processing step (b)) by a stage 2 wave field represented by $\lambda_2$ (the 2nd stage exposure to illuminate the hologram). The stage 2 wave field, which may be formed by standard lithographic means, causes selected regions of hologram 250 to be illuminated, while others are left dark. An interlayer 270 may be used to remove evanescent high frequencies from the pattern that exposes layer 260. The interlayer might have a thickness in the range of 0 (i.e. no interlayer) to about 200 nm, a typical thickness being for example 50 nm, and may have a similar refractive index to resist layer 250'. The resulting image pattern is formed in a photosensitive material layer 260, e.g., a resist pattern, having increased spatial frequency shown formed in a resist layer 260. A low sensitivity photoresist may be used for layer 260, for example a photoresist requiring 120 millijoules to expose one square centimeter of resist area. The refractive index of layer 260 might typically be about 1.7. The parent grating structure and inter layer are then removed and the resist is developed at step (c) to form daughter grating comprising fine-line Talbot bars 275, in the completed structure shown at (d). That is, at the next step (c), the parent grating and developed in step (c) form fine-line Talbot bars 275, e.g., at selected positions at step (d). The selected positions at which grating bars are formed are those beneath the portions of hologram 250 that are illuminated. It is understood that the bars of pattern 275 may be formed only at selected positions as shown in connection with FIG. 9.

FIG. 9 illustrates same method steps as implemented in FIG. 8 for fabricating a Line/space Talbot grating 275', however, rather than personalizing the image formed from a Talbot grating before removing the hologram (as in step (c) of FIG. 8), the grating 275 is exposed to make a uniform Talbot array 275. The resulting structure 275 is then trimmed with a patterned exposure after removing the hologram (fabricated as shown at a processing step (d) in FIG. 9 implementing a second exposure (a third stage wavefront)). Thus, in an alternative embodiment, a uniform array of fine lines 275 (printed with Talbot fringes) may be trimmed using a second exposure that is made after the parent hologram has been removed, to produce an array 275' where the fine lines are only present in selected regions. In this example embodiment, the stage 1 wave field might take the form of two interfering plane waves that are incident at equal and opposite angles, while the stage 2 wave field may be a normally incident plane wave, and the stage 3 wavefront (wave field) would project exposing light onto those bars of uniform grating 275 whose positions are not selected for pattern 275'.

It is understood that these two specialized forms of 2nd-stage illumination (coarse envelope, and post-trim) may be used together, and further that the hologram need not be restricted to a line/space parent grating in order to employ these personalization techniques.

However, it should also be pointed out that if the personalization technique of FIG. 9 is used in isolation, the resulting method constitutes something of an exception to the other systems described here. The difference is that in the approach depicted in FIG. 9, the wavefront used to expose the hologram is the rather trivial one of a null pattern, and the personalizing information is only applied after the hologram is removed. However, as mentioned above, the FIG. 9 personalization can also be used in embodiments where the wavefront exposing the hologram contains a non-null pattern.

Another embodiment commensurate in scope with the embodiments depicted in FIG. 8 and FIG. 9 requires a resist layer that can retain a latent image (without losing sensitivity) during processing to remove the hologram. One then forms such a latent image using a sub-threshold dose, and next superposes on the resist a second latent image after the hologram has been removed, giving the combined exposure sufficient magnitude to bring the total image above threshold for development. The sidewalls of the 2nd-stage image are arranged to fall along some of the sidewalls of the initial image, allowing the sidewalls of the total image to have a steeper slope than in a conventional projected image. (The steepness would be about midway between that of the 2nd-stage shape-defining image, and the steeper but rigidly laid out sidewalls of the 1st-stage Talbot image.)

Figure 10:
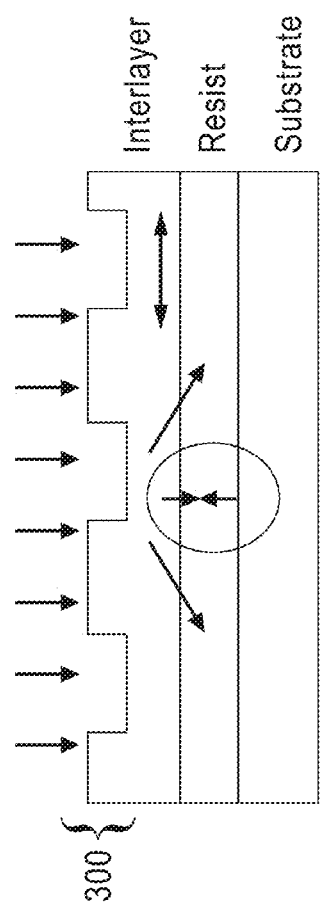
FIG. 10 depicts employment of an optimizable filter resulting in zero order suppression.

It should be understood that even the simplest holograms, such as a parent grating, will require optimized EMF behavior to extend resolution beyond current projection limits. As noted above, even embodiments of the present invention that resemble Talbot lithography will now require that the zero order be suppressed by a hologram that has been designed using sophisticated electromagnetic simulation as a component of the optimization procedure. Additionally, as mentioned above, optimization may involve changes in the refractive index of the hologram layers (within allowed limits), as well as in their profiles. For example, minimization of the zero order diffracted by the parent grating may involve the optimized design of interlayers that will produce reflections capable of canceling the propagating 0th order as illustrated in FIG. 10. FIG. 10 particularly depicts employment of an optimizable filter 300 formed to result in zero order suppression by the cancellation shown by the encircled opposing arrows.

Figure 11:
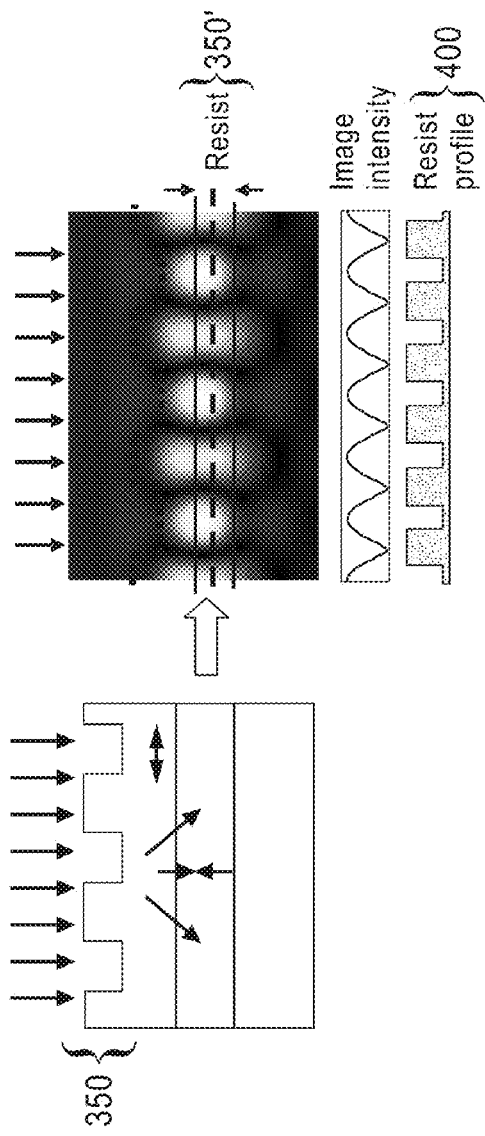
FIG. 11 depicts a hologram structure that has been optimized in this way to produce Talbot fringes of 60 nm pitch, along with a calculated final image.

FIG. 11 shows a hologram structure 350' that has been optimized in this way to produce Talbot fringes 400 of 60 nm pitch, along with the calculated final image. As shown in FIG. 11, an example resulting printed structure 400 is formed out of an example parent structure 350' having a pitch of about 120 nm, for example, and the resultant printed pitch 400 is 60 nm, when used with a resist (n,k) value of (1.73,0), for example.

A parallel set of embodiments are also possible with plasmonic lithography; these differ from the previous embodiments in that the hologram is formed from a plasmonic metal, capable of generating plasmon polaritons along its exit surface.

The present invention rather provides a process that uses plasmonic interference to enhance the resolution of projection lithography. A plasmonic metal is deposited on a resist layer and then patterned with a transmission hologram design. The features of that design are such that when the metal/resist stack is illuminated with a designed set of spatial frequencies of appropriate wavelength, counter-propagating surface plasmons are generated that interfere to produce standing waves which in turn expose the underlying resist. A thin lift-off layer could be located below the plasmonic metal and above the resist layer to facilitate simpler lift-off of the remaining metal, using enhanced plasmonic coupling to transfer the high frequency plasmonic modulation.

In one embodiment, the 2nd stage modulation provides an adjustable set of relatively coarse envelope boundary shapes that enclose fine plasmonic fringe areas in the printed image. Here much of the pattern tuning is carried out by varying the 2nd stage patterns.

Figure 12:
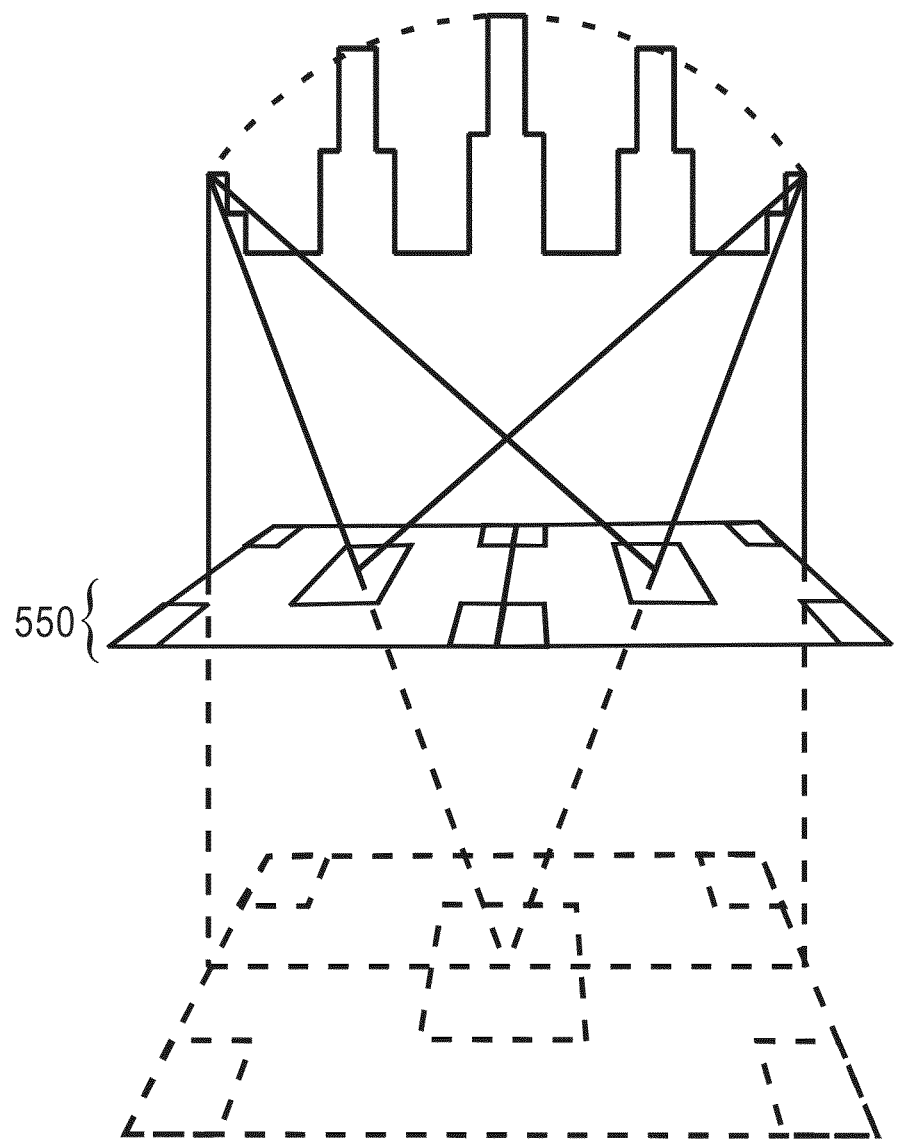
FIG. 12 depicts an example starting design for quasi-universal hologram to double the resolution of a projection lithography system (e.g., a 1-D doubler); and, FIG. 13 depicts an example Fresnel regime solution that creates diffraction orders of uniform amplitude to fill a doubled NA.

Another embodiment (non-plasmonic, in general) that aims for a degree of universality in the hologram is based on period-halving of periodic patterns that are more complex than those produced with Talbot imaging (i.e., more complex than simple line/space gratings). For exemplary purposes, there is considered the simple case of resolution doubling along only one dimension. If an input periodic pattern were successfully reproduced at ½ scale (as is the function of this embodiment), the amount of information contained in the output pattern would not be not fundamentally changed, since the same set of features would be present in both the input and output FIG. 12 depicts a starting design for quasi-universal hologram 500 to double the resolution of a projection lithography system. For purposes of illustration, a 1-D (doubler) structure is shown; that is, a structure which only doubles the resolution along the left-to-right axis of the pattern, leaving the resolution along the front-to-back axis unchanged. In this embodiment, the optical information content of the image is no larger than that collected from the object which, in turn, implies that the hologram which carries out the pattern shrinkage need not contribute pattern-specific information to the image. With periodic patterns it is possible to use the stage 2 exposure to provide all of the doubled-resolution pattern information without shrinking the exposure field, since this information is contained in the description of the unit cell, and a periodic hologram can demagnify the cell by 2× without changing the size of the exposure field if each hologram period spans two image periods, with the stage 1 exposure having a periodicity matched to that of the hologram. The spatial bandlimit of the light exiting the hologram will be twice that of the stage 2 exposure, but this will not increase the information content of the exit light since all even diffraction orders in the exit light will have zero amplitude, due to the two-fold tiling of the half-scale structure within each hologram period. To design such a quasi-universal hologram, the continuation method discussed above is modified to consider a suite of lithographic patterns, which might include all levels needed to fabricate a particular multilevel array of circuit devices. This approach requires a starting design in the Fresnel regime. An example of a starting design for such a universal hologram is shown schematically in FIG. 12.

The example structure depicted in FIG. 12 is derived from a 2:1 de-magnifying lenslet that is modulated by a +1/−1 grating 550. The hologram may be defined using binary or trinary Fresnel-like lenslets and splitting modulation, rather than lenslets with the focusing profiles shown. If a sufficient degree of universality is obtained in the hologram, it may be economical to fabricate it using imprint lithography. Many circuit applications in this regime are likely to permit a degree of feature variation at the half-harmonic, which eases the problem of correcting aberrations in the lenslet. (The full content of the mask area within the doubled field of the 2nd stage exposure remains available for control of aberrations at that scale.)

In many embodiments of the invention, it may be desirable to initially define the Fresnel-regime starting design in the frequency domain. "Wavefront engineering" may be used to design the reduction mask shapes that create the final optimized set of frequencies for each stage. Using a 1D example, for purposes of illustration, if the design period generates N diffraction orders during each exposure (i.e. in both the 1st stage exposure to form the hologram, and the 2nd stage exposure to illuminate the hologram), it is seen that specification of the 2N−1 diffraction orders of the combined image involves 2N−1 quadratic equations in 2N unknowns. As noted above, it is preferable to define the requirements of the combined image by means of the relatively flexible requirements that govern lithographic printing in binary resists. Attempting to maintain specific values in all 2N−1 image spatial frequencies would unnecessarily constrain the problem. However, such a specification is nonetheless useful in defining the starting design. In general, the resulting 2N−1 quadratic equations will have $2^{(N-1)}$ classes of solutions, each consisting of a nominally infinite set of feasible amplitudes to employ in the two exposures. (The reason that each set is infinitely degenerate is that one can always multiply the amplitudes in one set of spatial frequencies by an arbitrary constant, so long as the amplitudes in the other set are multiplied by the reciprocal of the constant.) This multiplicity of solutions eases the overall design problem, since a large number of distinct starting solutions are available for refinement. The system of quadratic equations can be solved by a well-known homotopy method. (This homotopy is of course different from the continuation method used to optimize the system for EMF effects.) In the homotopy to solve the simultaneous equations, all complicating terms of the polynomials are multiplied by a homotopy parameter which is initially set to zero. With the complicating terms zeroed out the polynomial roots are obtained analytically. Next the parameter is increased in slow steps until it reaches a value of 1, and in the process all roots are tracked using a local method (e.g. Newton). Techniques are known for taking root splitting and degeneracy into account.

Note that in embodiments where the image is offset from the hologram, the hologram profile need not actually resemble the superposed spatial frequencies that are being controlled to construct the desired image. For example, the hologram may have a binary profile whose evanescent high frequency components do not propagate to the resist layer.

Figure 13:
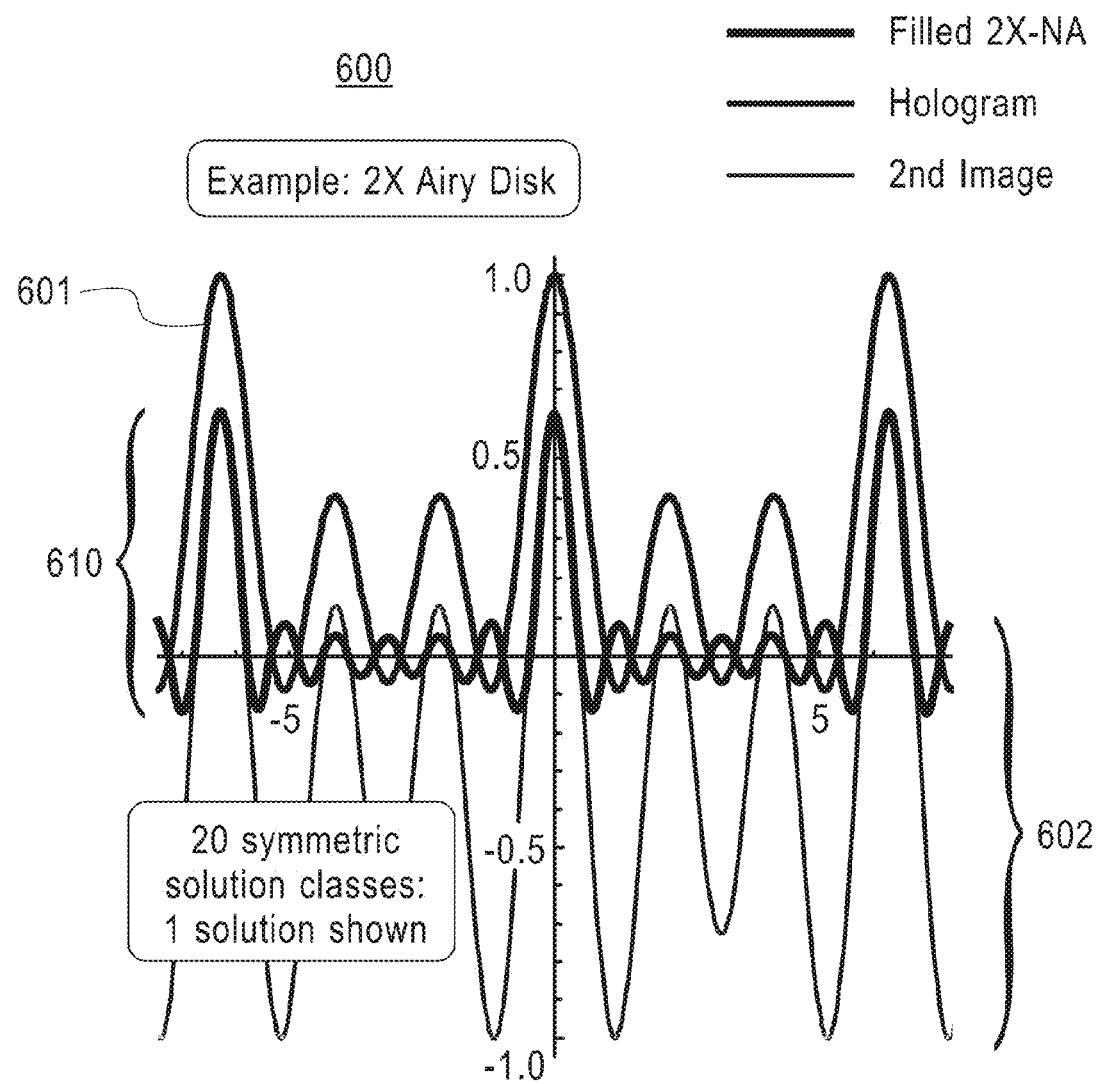

FIG. 13 shows an example of spatial frequency sets, for both the hologram (stage 1b, shown as pattern 601), and the stage 2 exposure (shown as pattern 602), which create an Airy disk image 610 equivalent to that from a hypothetical lens having twice the NA of the projection lens. Particularly, FIG. 13 depicts an example Fresnel regime solution 600 that creates diffraction orders of uniform amplitude to fill a doubled NA. In this example, each exposure uses seven (7) collected diffraction orders. In the Fresnel regime, the hologram can be defined by a transmission profile that is assumed shift invariant, and more specifically by the Fourier transform of this transmission profile. If the designed frequency content of the hologram includes a zero order, three diffraction orders in the positive direction, and three in the negative direction, then the controlled spectrum of the hologram will include seven (7) diffraction orders. However, if a symmetrical hologram structure is assumed for simplicity, it will then include only four (4) independently controlled spatial frequency orders, since the positive-direction and negative-direction orders will have equal amplitudes. If hologram formation and stage 2 exposure are both carried out using the same projection lithography tool, the stage 2 exposure will likewise consist of seven (7) diffraction orders, of which four (4) will have independent values if the stage 2 exposure is likewise assumed symmetric for purposes of discussion. The image pattern that is formed when the stage 2 exposure transmits through the hologram will then be symmetrical, and will contain thirteen (13) controlled spatial frequencies, namely a zero order, six (6) diffraction orders in the positive direction, and six (6) matching orders in the negative direction. As discussed above, the product of the Fourier transform of the hologram spatial frequencies and the Fourier transform of the stage 2 spatial frequencies must give the Fourier transform of the desired image spatial frequencies, and in this way the Fresnel-domain design problem is reduced to solving a set of polynomial equations, which may be solved by standard methods, such as homotopy.

In the example of FIG. 13, the desired image consists of a sharp impulse response function equivalent to that which would be produced by a hypothetical lens having double the numerical aperture (and therefore double the resolution) of the lens actually used in the stages 1 and 2 exposures. More specifically, the hologram and stage 2 exposure produce a transmitted image pattern consisting of thirteen (13) diffraction orders of equal amplitude, as would be formed if a uniform wavefront were focused through a hypothetical lens having twice the numerical aperture of the lens actually used in the stages 1 and 2 exposures. As noted above, the Fresnel solutions for the hologram and stage 2 exposures are not discrete, but instead come in groups each including a continuously variable degree of freedom that can be tuned through an infinite set of solutions which all provide the same transmitted field within a constant of proportionality. In the case of the FIG. 13 example, one finds after algebraically solving the simultaneous equations that there are twenty (20) such solution families. A representative member of each family can be obtained by requiring that equal contributions be made by the extreme spatial frequency in the hologram and the extreme spatial frequency in the stage 2 exposure when the extreme sum frequency of the image is formed.

More particularly, FIG. 13 depicts a simple example plot 600 showing the superpositions of the spatial frequencies in the hologram 601 and the 2nd exposure 602, e.g., in a starting design. A "stage 1" pattern is plotted as a sum of these spatial frequencies, but the hologram may actually include many other spatial frequencies as well. Initially, in the design process, the stage 1 wavelength is only set at ⅕th its final physical value. It is understood that in the starting design, the Fourier transform of all spatial frequencies represents a transmission function. The resulting hologram will not actually resemble the plotted sum of the relevant low frequency components when the wavelength is initialized to a low value, and in addition complex electromagnetic interactions may strongly impact the hologram profile as the wavelength is adjusted to take on its physical value. Thus, while the example 600 shown in FIG. 13 utilizes an Airy disk @ 2×NA, it is found that each exposure provides 7 collected diffraction orders; the Image contains 13 diffraction orders, filling twice as large an NA. In this example, an image is formed directly under hologram (100 nm-200 nm offset being more typical, particularly when the hologram uses phase modulation).

The present invention has been described with reference to flow diagrams and/or block diagrams of methods, apparatus (systems) and computer program products according to embodiments of the invention. It will be understood that each flow and/or block of the flow diagrams and/or block diagrams, and combinations of flows and/or blocks in the flow diagrams and/or block diagrams, can be implemented by computer program instructions. These computer program instructions may be provided to a processor of a general purpose computer, special purpose computer, embedded processor or other programmable data processing apparatus to produce a machine, such that the instructions, which execute via the processor of the computer or other programmable data processing apparatus, create means for implementing the functions specified in the flow diagram flow or flows and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flow diagram flow or flows and/or block diagram block or blocks.

The computer program instructions may also be loaded onto a computer-readable or other programmable data processing apparatus to cause a series of operational steps to be performed on the computer or other programmable apparatus to produce a computer implemented process such that the instructions which execute on the computer or other programmable apparatus provide steps for implementing the functions specified in the flow diagram flow or flows and/or block diagram block or blocks.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

We claim:

1. A method for designing a mask implemented for fabricating a hologram structure in a photosensitive layer of a semiconductor stack and for generating an optimized wavefield for illuminating said hologram structure to achieve a specified image target comprising alternating bright and dark pattern region in a photosensitive material layer of said stack, said method comprising:

selecting a preliminary wave field and hologram diffractive properties using a scalar model at an artificially reduced spatial frequency wavelength;

implementing wavefront engineering method to generate a physical structure for said hologram in a preliminary solution and a $1^{st}$ stage wave field for modulating said hologram;

implementing local optimization to provide an optimized design for said hologram and a wavefront at the artificially decreased wavelength;

incrementing the wavelength in a small upward increment;

refining, at said incremented wavelength, said local optimization to tune in a solution for the current incremented wavelength by adjusting variables of a hologram profile, an index of the hologram features and a film stack beneath the hologram; and, iterating between said wavelength incrementing and refining to arrive at a solution which is valid at an operating wavelength, said solution including a $2^{nd}$ stage wave field for modulating said hologram, wherein a spatial frequency modulation in a resulting image includes the same bright and dark regions as the image target; and, generating a pair of lithographic masks suitable to generate $1^{st}$ stage and $2^{nd}$ stage wave fields at respective first and second sets of spatial frequencies using said wavefront engineering method.

2. The mask design method as claimed in claim 1, further including: employing an electromagnetic optimizer when iterating between said wavelength incrementing and refining, said optimizer maximizing lithographic process window utilization and, maximizing a range of light dose and focus fluctuations within which the bright and dark polarity patterns in the developed image match the target patterns to within an acceptable tolerance.

3. The mask design method as claimed in claim 1, wherein said iterating between said wavelength incrementing and refining results in a solution valid at a specified operating wavelength.

4. The mask design method as claimed in claim 1, wherein said hologram structure is a parent grating structure, said iterating between said wavelength incrementing and refining resulting in a solution having a minimized zero order diffraction by the parent grating by an interlayer designed to produce reflections capable of canceling a propagating $0^{th}$ order wavefront.

5. A program storage device readable by a machine, tangibly embodying a program of instructions executable by the machine to perform method steps for designing a mask implemented for fabricating a hologram structure in a photosensitive layer of a semiconductor stack and for generating an optimized wavefield for illuminating said hologram structure to achieve a specified image target comprising alternating bright and dark pattern region in a photosensitive material layer of said stack, said method steps comprising:

a) selecting a preliminary wave field and hologram diffractive properties using a scalar model at an artificially reduced spatial frequency wavelength;

implementing wavefront engineering method to generate a physical structure for said hologram in a preliminary solution and a $1^{st}$ stage wave field for modulating said hologram;

implementing local optimization to provide an optimized design for said hologram and a wavefront at the artificially decreased wavelength;

incrementing the wavelength in a small upward increment;

refining, at said incremented wavelength, said local optimization to tune in a solution for the current incremented wavelength by adjusting variables of a hologram profile, an index of the hologram features and a film stack beneath the hologram; and, iterating between said wavelength incrementing and refining to arrive at a solution which is valid at an operating wavelength, said solution including a $2^{nd}$ stage wave field for modulating said hologram, wherein a spatial frequency modulation in a resulting image includes the same bright and dark regions as the image target; and, generating a pair of lithographic masks suitable to generate $1^{st}$ stage and $2^{nd}$ stage wave fields at respective first and second sets of spatial frequencies using said wavefront engineering method.

* * * * *